US009680035B1

(12) United States Patent
Chary et al.

(10) Patent No.: US 9,680,035 B1
(45) Date of Patent: Jun. 13, 2017

(54) SURFACE MOUNT SOLAR CELL WITH INTEGRATED COVERGLASS

(71) Applicant: Solar Junction Corporation, San Jose, CA (US)

(72) Inventors: Sathya Chary, San Francisco, CA (US); Ewelina Lucow, Los Galos, CA (US); Sabeur Siala, Sunnyvale, CA (US); Ferran Suarez, San Jose, CA (US); Ali Torabi, Los Gatos, CA (US); Lan Zhang, Palo Alto, CA (US)

(73) Assignee: Solar Junction Corporation, San Jose, CA (US)

( * ) Notice: Subject to any disclaimer, the term of this patent is extended or adjusted under 35 U.S.C. 154(b) by 0 days.

(21) Appl. No.: 15/288,559

(22) Filed: Oct. 7, 2016

Related U.S. Application Data

(60) Provisional application No. 62/342,660, filed on May 27, 2016.

(51) Int. Cl.
*H01L 31/0224* (2006.01)
*H01L 31/18* (2006.01)
*H01L 31/02* (2006.01)
*H01L 31/0725* (2012.01)
*H01L 31/0216* (2014.01)

(52) U.S. Cl.
CPC .. *H01L 31/02008* (2013.01); *H01L 31/02168* (2013.01); *H01L 31/022441* (2013.01); *H01L 31/0725* (2013.01); *H01L 31/186* (2013.01)

(58) Field of Classification Search
CPC ......... H01L 31/02168; H01L 31/02008; H01L 31/024433; H01L 31/03865; H01L 31/03921; H01L 31/0795; H01L 31/022441; H01L 31/02245;
(Continued)

(56) References Cited

U.S. PATENT DOCUMENTS 3,903,427 A 9/1975 Pack
4,062,698 A 12/1977 Blakeslee et al.
(Continued)

FOREIGN PATENT DOCUMENTS

EP 2254156 11/2010
WO 2011/137305 11/2011
(Continued)

OTHER PUBLICATIONS

"C10100 Oxygen-Free Copper", Anchor Bronze & Metals, Inc., accessed at <http://web.archive.org/web/20080727020042/http://www.anchorbronze.com/c10100.htm> and dated Jul. 27, 2008.
(Continued)

*Primary Examiner* — Bethany L Martin

(57) ABSTRACT

Photovoltaic cells, methods for fabricating surface mount multijunction photovoltaic cells, methods for assembling solar panels, and solar panels comprising photovoltaic cells are disclosed. The surface mount multijunction photovoltaic cells include through-wafer-vias for interconnecting the front surface epitaxial layer to a contact pad on the back surface. The through-wafer-vias are formed using a wet etch process that removes semiconductor materials non-selectively without major differences in etch rates between heteroepitaxial III-V semiconductor layers.

13 Claims, 22 Drawing Sheets

(58) Field of Classification Search
CPC ............ H01L 31/0687; H01L 31/0725; H01L 31/076; H01L 31/18; H01L 31/186
See application file for complete search history.

(56) References Cited

U.S. PATENT DOCUMENTS

| | | | |
|---|---|---|---|
| 4,163,677 A | 8/1979 | Carlson et al. |
| 4,180,414 A | 12/1979 | Diamond et al. |
| 4,209,347 A | 6/1980 | Klein |
| 4,209,698 A | 6/1980 | Hoppe |
| 4,367,368 A | 1/1983 | Wolf |
| 4,491,681 A | 1/1985 | Kirpich |
| 4,830,678 A | 5/1989 | Todorof et al. |
| 4,834,805 A | 5/1989 | Erbert |
| 4,838,952 A | 6/1989 | Dill et al. |
| 4,999,060 A | 3/1991 | Szekely et al. |
| 5,118,361 A | 6/1992 | Fraas et al. |
| 5,178,685 A | 1/1993 | Borenstein et al. |
| 5,460,659 A | 10/1995 | Krut |
| 5,500,052 A | 3/1996 | Horiuchi et al. |
| 5,700,737 A | 12/1997 | Yu et al. |
| 5,741,626 A | 4/1998 | Jain et al. |
| 5,935,345 A | 8/1999 | Kuznicki |
| 5,944,913 A | 8/1999 | Hou et al. |
| 6,281,426 B1 | 8/2001 | Olson et al. |
| 6,316,348 B1 | 11/2001 | Fu et al. |
| 6,623,283 B1 | 9/2003 | Torigian et al. |
| 6,663,982 B1 | 12/2003 | Stephens et al. |
| 7,449,630 B2 | 11/2008 | Ho et al. |
| 7,488,890 B2 | 2/2009 | Takamoto et al. |
| 7,514,782 B2 | 4/2009 | Hiramatsu et al. |
| 7,687,707 B2 | 3/2010 | Meck et al. |
| 7,727,795 B2 | 6/2010 | Stan et al. |
| 7,851,693 B2 | 12/2010 | Fork et al. |
| 7,972,875 B2 | 7/2011 | Rogers et al. |
| 8,115,097 B2 | 2/2012 | Guha et al. |
| 8,669,466 B2 | 3/2014 | Guha et al. |
| 9,337,360 B1 | 5/2016 | Wiemer et al. |
| 2003/0029497 A1 | 2/2003 | Tanaka |
| 2004/0119149 A1 | 6/2004 | Yin Pang et al. |
| 2005/0072457 A1 | 4/2005 | Glenn |
| 2005/0155641 A1 | 7/2005 | Fafard |
| 2006/0162768 A1 | 7/2006 | Wanlass et al. |
| 2006/0163596 A1 | 7/2006 | Kim et al. |
| 2006/0185716 A1 | 8/2006 | Murozono et al. |
| 2006/0240599 A1 | 10/2006 | Amano et al. |
| 2007/0089774 A1 | 4/2007 | Lasich |
| 2007/0090517 A1 | 4/2007 | Moon et al. |
| 2007/0240760 A1 | 10/2007 | Gronet |
| 2007/0241450 A1 | 10/2007 | Hiramatsu et al. |
| 2007/0290287 A1 | 12/2007 | Freedman |
| 2008/0105298 A1 | 5/2008 | Lu et al. |
| 2008/0135088 A1 | 6/2008 | Corrales |
| 2008/0150064 A1 | 6/2008 | Zimmerman et al. |
| 2008/0185040 A1 | 8/2008 | Tom et al. |
| 2008/0190480 A1 | 8/2008 | Joshi |
| 2008/0230110 A1 | 9/2008 | Freedman |
| 2008/0276981 A1 | 11/2008 | Kinoshita et al. |
| 2008/0315398 A1 | 12/2008 | Lo et al. |
| 2009/0020152 A1 | 1/2009 | Lin |
| 2009/0064994 A1 | 3/2009 | Weatherby et al. |
| 2009/0086478 A1 | 4/2009 | Sanroma et al. |
| 2009/0120500 A1 | 5/2009 | Prather et al. |
| 2009/0159126 A1 | 6/2009 | Chan |
| 2009/0229659 A1 | 9/2009 | Wanlass et al. |
| 2009/0255575 A1 | 10/2009 | Tischler |
| 2009/0266395 A1 | 10/2009 | Murthy et al. |
| 2009/0272438 A1 | 11/2009 | Cornfeld |
| 2009/0298218 A1 | 12/2009 | Federici et al. |
| 2010/0037935 A1 | 2/2010 | Vaid et al. |
| 2010/0051085 A1 | 3/2010 | Weidman et al. |
| 2010/0089447 A1 | 4/2010 | Basol et al. |
| 2010/0126573 A1 | 5/2010 | Youtsey et al. |
| 2010/0132765 A1 | 6/2010 | Cumpston et al. |
| 2010/0139752 A1 | 6/2010 | Fang |
| 2010/0180936 A1 | 7/2010 | Kim |
| 2010/0218816 A1* | 9/2010 | Guha .................. H01L 31/0682 136/256 |
| 2010/0236603 A1 | 9/2010 | Menard et al. |
| 2010/0258178 A1 | 10/2010 | Jang et al. |
| 2010/0294362 A1 | 11/2010 | Christ et al. |
| 2010/0313954 A1 | 12/2010 | Seel et al. |
| 2010/0326429 A1 | 12/2010 | Cumpston et al. |
| 2010/0326492 A1 | 12/2010 | Tan et al. |
| 2010/0326518 A1 | 12/2010 | Juso et al. |
| 2011/0030764 A1 | 2/2011 | Seo et al. |
| 2011/0048535 A1 | 3/2011 | Nagyvary |
| 2011/0108113 A1 | 5/2011 | Arikawa |
| 2011/0132426 A1* | 6/2011 | Kang ................ H01L 31/02245 136/244 |
| 2011/0265871 A1 | 11/2011 | Lamarche |
| 2012/0025618 A1 | 2/2012 | Erickson, Jr. et al. |
| 2012/0189800 A1 | 7/2012 | Fujiwara et al. |
| 2012/0199194 A1 | 8/2012 | Lamarche et al. |
| 2012/0199195 A1 | 8/2012 | Lamarche |
| 2012/0199196 A1 | 8/2012 | Lamarche |
| 2012/0276676 A1* | 11/2012 | Cornfeld .......... H01L 31/06875 438/64 |
| 2013/0118566 A1 | 5/2013 | Albertus et al. |
| 2013/0130431 A1 | 5/2013 | Albertus et al. |
| 2013/0263920 A1* | 10/2013 | Fidaner ............. H01L 31/02244 136/255 |
| 2013/0312817 A1 | 11/2013 | Fidaner et al. |
| 2014/0048128 A1 | 2/2014 | Meitl et al. |
| 2014/0196779 A1 | 7/2014 | Fidaner et al. |
| 2015/0349181 A1 | 12/2015 | Fidaner et al. |

FOREIGN PATENT DOCUMENTS

| | | |
|---|---|---|
| WO | 2012/106160 | 8/2012 |
| WO | 2012/106165 | 8/2012 |

OTHER PUBLICATIONS

Chen et al., Journal of Vacuum Science and Technology B, 2009, vol. 27, No. 5, p. 2166.

Clawson, Materials Science and Engineering, 2001, vol. 31, p. 1-438.

Cotal et al., "III-V multijunction solar cells for concentrating photovoltaics", Energy and Environment Science, Dec. 10, 2008, pp. 174-192.

Danzilio, CS Mantech Conference, May 14-17, 2007, Austin, TX, p. 11-14.

Friedman et al., "Breakeven Criteria for the GaInNAs Junction in GaInP/GaAs/GaInNAs/Ge Four-junction Solar Cells", Progress in Photovoltaics: Research and Applications, 2002, p. 331-344.

Garcia et al., "Analysis of Tellurium as N-Type Dopant in GaInP: Doping, Diffusion, Memory Effect and Surfactant Properties", pp. 794-799, Journal of Crystal Growth 298 (2007), www.sciencedirect.com Available online Dec. 4, 2006.

Geelen et al., Epitaxial Lift-Off GaAs Solar Cell From a Reusable GaAs Substrate, pp. 162-171, Materials Science and Engineering B45 (1997).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Jackrel et al., Dilute nitride GaInNAs and GaInNAsSb solar cells by molecular beam epitaxy, pp. 1-8, Journal of Applied Physics 101, 114916, (2007).

Janotti et. al., Mutual Passivation of Electrically Active and Isovalent Impurities in Dilute Nitrides, Physical Review Letters 100, 045505 (2008).

Ng et al., 1EV GANXAS1-X-YSBY Material for Lattice-Matched III-V Solar Cell Implementation on GaAs and Ge, pp. 76-80, (2009).

Ptak et al., Low-acceptor-Concentration GaInNAs grown by Molecular-beam Epitaxy for High-current p-i-n. solar cell applications, Journal of Applied Physics 98, 094501 (2005).

(56) References Cited

OTHER PUBLICATIONS

Van Kerschaver et al., Progress in Photovoltaics: Research and Applications, 2006, vol. 14, p. 107-123.
Volz et al., Optimization of Annealing Conditions of (GaIn)(NAs) for Solar Cell Applications, pp. 2222-2228, Journal of Crystal Growth 310 (2008), www.sciencedirect.com Available online Dec. 4, 2007.
Wu et al., Band Anticrossing in Highly Mismatched III-V Semiconductor Alloys, pp. 860-869, Semiconductor Science and Technology 17 (2002).
Yamaguchi et al., "Multi-junction III-V solar cells: Current status and future potential", Solar Energy, Jul. 2005, vol. 79, Issue 1, Abstract [online]. Retrieved on Jan. 12, 2011, at URL: <http://www.sciencedirect.com/science?_ob=ArticleURL&_udi=B6V50-4DNW4BV-3&_user=10&_coverDate=07%2F31%2005&_rdoc=1&_fmt=high&_orig=search&_origin=search&_sort=d&_doc anchor=&view=c&_searchStrId=1605061367&_rerunOrigin=scholar.google&_acct=C000050221&_version=1&_urlVersion=0&_userid=10&md5=d794dede36e6c739dc0c9b7e27d43a2&searchtype=a>.
Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).
Zaknoune et al., J. Vac. Sci Technol. B, 1998, vol. 16, No. 223.
International Search Report and Written Opinion corresponding to PCT/US2011/036486, mailed Aug. 25, 2011, 12 pages.
International Search Report and Written Opinion corresponding to PCT/US2010/056800, mailed Jan. 26, 2011, 8 pages.
International Search Report and Written Opinion corresponding to PCT/US2012/022611, mailed Jun. 21, 2012, 9 pages.
International Search Report and Written Opinion corresponding to PCT/US2012/022539, mailed May 23, 2012, 10 pages.
International Search Report and Written Opinion corresponding to PCT/US2011/034485, mailed Aug. 3, 2011, 9 pages.
International Preliminary Report on Patentability corresponding to the PCT application No. PCT/US2011/034485, date of mailing Nov. 15, 2012, 7 pages total.
International Search Report and Written Opinion of the International Searching Authority for PCT Application No. PCT/US2012/022539, mailed on May 23, 2012, 10 pages.
International Search Report and Written Opinion of the International Searching Authority for PCT Application No. PCT/US2012/022611, mailed on Jun. 21, 2012, 9 pages.
Non-Final Office Action mailed on Nov. 21, 2013 for U.S. Appl. No. 12/944,361, 11 pages.
Final Office Action mailed on Apr. 15, 2014, for U.S. Appl. No. 12/944,361, 13 pages.
Notice of Allowance mailed on Jan. 12, 2016, for U.S. Appl. No. 12/944,361, 22 pages.
Non-Final Office Action mailed on Dec. 19, 2012 for U.S. Appl. No. 13/224,204, 14 pages.
Non-Final Office Action mailed on Mar. 14, 2013 for U.S. Appl. No. 13/092,555, 12 pages.
Non-Final Office Action mailed on Dec. 11, 2013 for U.S. Appl. No. 13/092,555, 12 pages.
Non-Final Office Action mailed on Dec. 20, 2013 for U.S. Appl. No. 13/224,181, 10 pages.
Non-Final Office Action mailed on Aug. 1, 2013 for U.S. Appl. No. 13/224,204, 15 pages.
Non-Final Office Action mailed on Mar. 14, 2013, for U.S. Appl. No. 13/224,204, 16 pages.
Non-Final Office Action mailed on Mar. 14, 2013 for U.S. Appl. No. 13/224,232, 16 pages.
Final Office Action mailed on Dec. 17, 2013 for U.S. Appl. No. 13/224,232, 19 pages.
Notice of Allowance mailed on Jul. 8, 2014, for U.S. Appl. No. 13/224,204, 10 pages.
Final Office Action mailed Aug. 1, 2014 for U.S. Appl. No. 13/092,555, 13 pages.
Notice of Allowance mailed on Sep. 30, 2015, for U.S. Appl. No. 13/092,555, 31 pages.
Final Office Action mailed on Jul. 31, 2013 for U.S. Appl. No. 13/224,181, 14 pages.
Notice of Allowance mailed on Dec. 4, 2014, for U.S. Appl. No. 13/224,232, 8 pages.
Non-Final Office Action mailed on Jul. 7, 2014 for U.S. Appl. No. 13/224,232, 19 pages.
Partial international Search Report for Application No. PCT/US2017/014125, mailed on Apr. 4, 2017, 7 pages.
Non-Final Office Action for U.S. Appl. No. 15/332,036, mailed on Mar. 2, 2017, 31 pages.

* cited by examiner

SURFACE MOUNT SOLAR CELL WITH INTEGRATED COVERGLASS

This application claims the benefit under 35 U.S.C. §119 (e) of U.S. Provisional Application No. 62/342,660 filed on May 27, 2016, which is incorporated by reference in its entirety.

FIELD

This disclosure relates to photovoltaic cells, methods for fabricating photovoltaic cells, methods for assembling solar panels, and solar panels comprising photovoltaic cells. Particularly, the disclosure relates to surface mount multijunction photovoltaic cells. The surface mount multijunction photovoltaic cells include through-wafer-vias for interconnecting the front surface epitaxial layer to a contact pad on the back surface. The through-wafer-vias are formed using a wet etch process that removes semiconductor materials non-selectively without major differences in etch rates between heteroepitaxial III-V semiconductor layers.

BACKGROUND

Conventional multijunction solar cells have been widely used for terrestrial and space applications because of their high efficiency. Multijunction solar cells (100), as shown in FIG. 1, include multiple diodes in series connection, known in the art as junctions or subcells (106, 107, and 108), realized by growing thin regions of epitaxy in stacks on semiconductor substrates. Each subcell in a stack possesses a unique bandgap and is optimized for absorbing a different portion of the solar spectrum, thereby improving efficiency of solar energy conversion. These subcells are chosen from a variety of semiconductor materials with different optical, electrical, and physical properties in order to absorb different portions of the solar spectrum. The materials are arranged such that the bandgap of the subcells becomes progressively smaller from the top subcell (106) to the bottom subcell (108). Thus, high-energy photons are absorbed in the top subcell and less energetic photons pass through to the lower subcells where they are absorbed. In every subcell, electron-hole pairs are generated and current is collected at ohmic contacts in the solar cell. Semiconductor materials used to form the subcells include, for example, germanium and alloys of one or more elements from group III and group V on the periodic table. Examples of these alloys include, for example, indium gallium phosphide, indium phosphide, gallium arsenide, aluminum gallium arsenide, indium gallium arsenide, and dilute nitride compounds. For ternary and quaternary compound semiconductors, a wide range of alloy ratios can be used.

Using conventional photovoltaic cells, solar arrays used to power space satellites are typically assembled manually which results in high cost and introduces the risk of reliability issues. Nearly all currently available space photovoltaic cells employ welded interconnect tabs for interconnecting adjacent cells, and a welded or monolithically integrated bypass diode on each individual photovoltaic cell. Photovoltaic cells assembled with bypass diodes, interconnects, and coverglass are referred to in the aerospace industry as "Coverglass Interconnected Cells" or "CICs". These CICs are typically assembled using manual process steps. The mechanical design of commercially available CICs has not changed substantially in the past two decades.

To reduce the number of overall steps associated with the expensive, manual process steps used in both CIC and solar array assembly, the industry has been moving to increasingly larger CICs using both 4-inch and 6-inch Ge substrates.

Normally, a photovoltaic cell contributes around 20% to the total cost of a photovoltaic power module. Higher photovoltaic cell efficiency means more cost effective modules. Fewer photovoltaic devices are then needed to generate the same amount of output power, and the generation of higher power with fewer devices leads to reduced system costs, such as costs for structural hardware, assembly processes, wiring for electrical connections, etc. In addition, by using high efficiency photovoltaic cells to generate the same power, less surface area, fewer support structures, and lower labor costs are required for assembly installation.

Photovoltaic modules are a significant component in spacecraft power systems. Lighter weight and smaller photovoltaic modules are always preferred because the lifting cost to launch satellites into orbit is very expensive. Efficient surface area utilization of photovoltaic cells is especially important for space power applications to reduce the mass and fuel penalty associated with large photovoltaic arrays. Higher specific power (watts generated over photovoltaic array mass), which reflects the power one solar array can generate for a given launch mass, can be achieved with more efficient photovoltaic cells because the size and weight of the photovoltaic array will be less for the same power output. Additionally, higher specific power can be achieved using smaller cells more densely arranged over a photovoltaic array of a given size and shape.

Interconnection of multijunction photovoltaic cells is typically accomplished by welding interconnect ribbons to front side and back side contacts on the p- and n-sides of the device. Interconnecting multijunction photovoltaic cells using these methods can be costly. To minimize interconnection costs it can be desirable to use larger area photovoltaic cells to reduce the number of interconnects that need to be formed for a given panel area. This can lead to a reduction in surface area utilization. Interconnect welding is usually the most delicate operation in CIC assembly.

It is desirable to develop alternative device structures and methods for interconnecting multijunction photovoltaic cells to solar cell subsystems.

SUMMARY

According to aspects of the invention, a surface mount multijunction photovoltaic cell comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a back surface solder pad underlying a portion of and electrically connected to the back substrate surface; a front surface solder pad underlying and insulated from the back substrate surface; and a through-wafer-via interconnecting the front surface solder pad and the front surface contact.

According to aspects of the invention, a photovoltaic module comprises a plurality of the surface mount multijunction photovoltaic cells according to the present invention.

According to aspects of the invention, a power system comprises a photovoltaic module according to the present invention.

According to aspects of the invention, a method of fabricating a multijunction photovoltaic cell comprises: providing a semiconductor wafer, wherein the semiconductor wafer comprises: a substrate having a front substrate surface and a back substrate surface; a heteroepitaxial layer overlying the front substrate surface; a front surface contact overlying and electrically connected to a portion of the heteroepitaxial layer; an optical adhesive overlying the front surface contact and the heteroepitaxial layer; and a coverglass overlying the optical adhesive layer; and thinning the substrate.

According to aspects of the invention, a surface mount multijunction photovoltaic cell comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a passivation layer underlying a portion of the back substrate surface; a back metal pad underlying a portion of the passivation layer; a through-wafer-via electrically interconnecting the front metal contact and the back metal pad; and a backside metal electrically connected to the back substrate surface.

According to aspects of the invention, a photovoltaic module comprises a plurality of the surface mount multijunction photovoltaic cells according to the present invention.

According to aspects of the invention, a method of fabricating a photovoltaic module comprises interconnecting at least one of the surface mount multijunction photovoltaic cells according to the present invention to an interconnection substrate.

According to aspects of the invention, a method of fabricating a multijunction photovoltaic cell comprises: providing a semiconductor wafer, wherein the semiconductor wafer comprises: a substrate having a front substrate surface and a back substrate surface; a heteroepitaxial layer overlying the front substrate surface; and a patterned cap region overlying a first portion of the heteroepitaxial layer; etching a through-wafer-via extending from the heteroepitaxial layer to within the substrate; depositing an antireflection coating on a second portion of the heteroepitaxial layer and on a sidewall and a bottom of the through-wafer-via; etching the antireflection coating on the bottom of the through-wafer-via to expose the substrate; depositing a front surface contact overlying at least a portion of the patterned cap region, the antireflection coating within the patterned cap region, the sidewalls of the through-wafer-via, and the bottom of the through-wafer-via; applying an optical adhesive overlying the front surface contact, the patterned cap region, and the antireflection coating; applying a coverglass overlying the optical adhesive; and thinning the substrate.

BRIEF DESCRIPTION OF DRAWINGS

The drawings described herein are for illustration purposes only. The drawings are not intended to limit the scope of the present disclosure.

FIGS. 5 and 17-26 illustrate a process flow for fabricating a multijunction photovoltaic cell with TWVs according to certain embodiments provided by the present disclosure.

Figure 1:
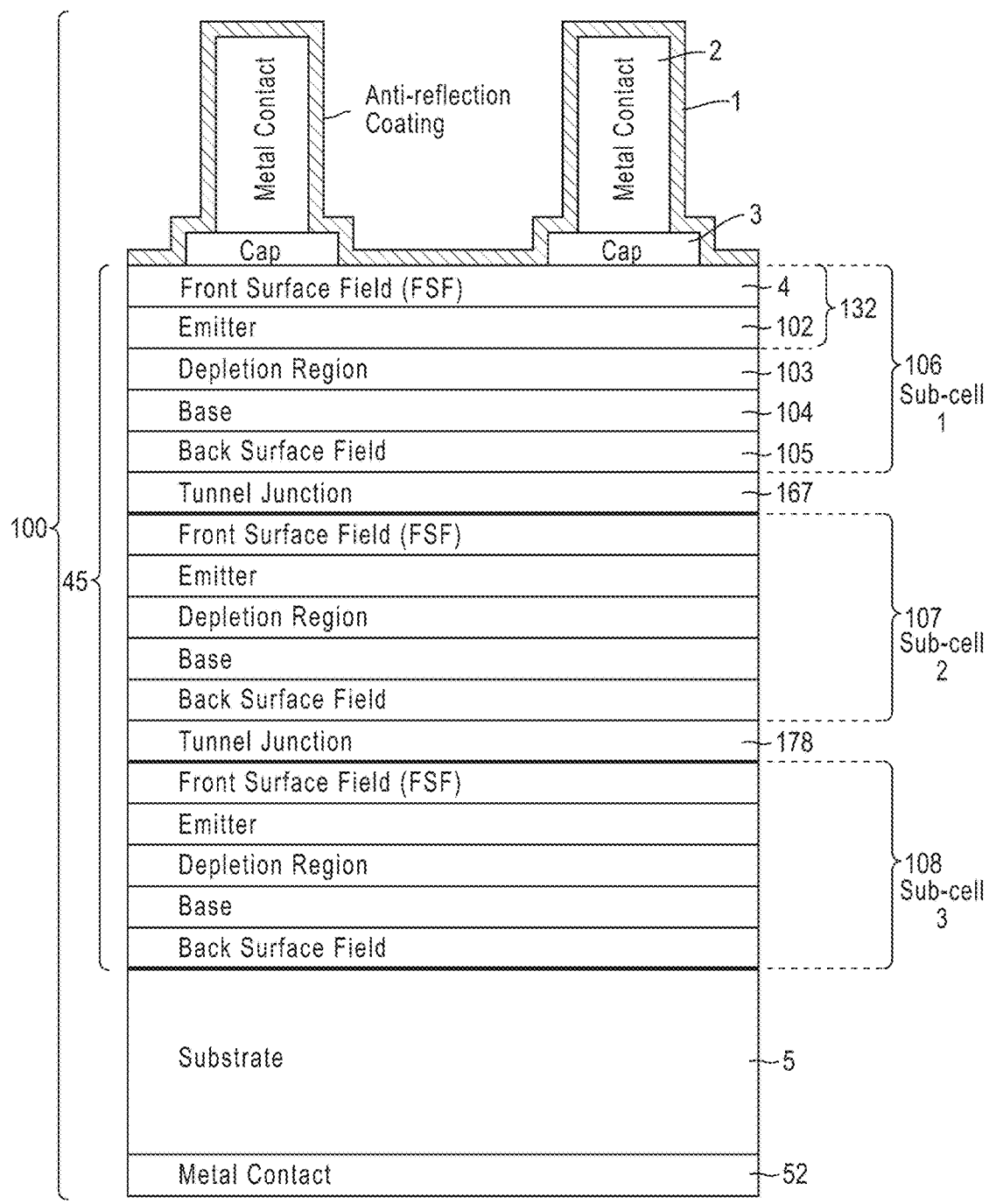
FIG. 1 shows a cross-section of a multijunction photovoltaic cell.

In the following detailed description, reference is made to the accompanying drawings that illustrate specific embodiments.

Reference is now made in detail to certain embodiments of the present disclosure. While certain embodiments of the present disclosure are described, it will be understood that it is not intended to limit the embodiments of the present disclosure to the disclosed embodiments. To the contrary, reference to embodiments of the present disclosure is intended to cover alternatives, modifications, and equivalents as may be included within the spirit and scope of the embodiments of the present disclosure as defined by the appended claims.

DETAILED DESCRIPTION

The devices and methods of the present invention address and in certain aspects eliminate a number of complicated, manual processes in the assembly of CICs. Also, from a cost perspective, the devices and methods of the present invention facilitate high speed, low cost, automated assembly of solar arrays for use in satellites and other solar energy systems. This is achieved using photovoltaic cells with through-wafer-vias, all-backside surface mount contacts with coverglass integrated at the wafer-level. These devices are referred to as surface mount coverglass cells (SMCCs). With all of the electrical contacts on the backside of the photovoltaic cell, individual photovoltaic cells can be assembled onto printed wiring boards (PWBs), printed circuit boards (PCBs) or other interconnection substrate to provide a solar array using standard electronics industry pick-and-place assembly equipment and practices. SMCC multijunction photovoltaic cells (SMCC) can be surface mounted to a variety of substrates using well-known, low cost, high throughput, surface mount methods used throughout the semiconductor industry. With the resulting decrease in interconnection costs and assembly costs, smaller SMCC die can be economically employed to provide improved solar array area utilization. Surface mount interconnects eliminate the need to weld interconnect tabs or a bypass diode to the frontside metal. This results in the elimination of costly manufacturing processes and thereby reduces the overall cost of fabricating and assembling a solar array. The use of well-developed automated assembly methods eliminates workmanship issues resulting in higher reproducibility and reliability. Because automated assembly methods can be used, SMCCs can have smaller dimensions, which results in higher wafer and solar array area utilization.

Because a surface mount cell with integrated coverglass (SMCC) eliminates the need for post-cell-processing application of coverglass to individual photovoltaic cells the size of the photovoltaic cell can be reduced without the corresponding increase in assembly processes and costs associated with CIC production, thereby increasing the number of photovoltaic cells that can be included in a given area, and increasing the active area on a particular solar array. This provides a significant increase in power per area (power density) compared to a traditional solar array employing traditional CICs. Because SMCCs eliminate the need for welded interconnections, the distance between adjacent photovoltaic cells is reduced, and photovoltaic cells can be densely packed. Additionally, the small photovoltaic cell size also results in higher cell efficiency due to a reduction in grid line resistance loss. Furthermore, the overall wafer yield is increased because small photovoltaic cells that do not meet electrical performance specifications can be yielded out of the diced wafer, compared to a defect on a large area cell that may result in the need to discard the full wafer.

Applying coverglass at the wafer-level facilitates the ability to thin the substrate. The coverglass can serve as a carrier during subsequent process of the photovoltaic cell. The process for forming through-wafer-vias (TWVs) can be combined with a step in which the substrate is thinned Thinning the substrate can significantly reduce the mass of the photovoltaic cell, which can be important, for example, in space applications.

Radiation resistant coverglass is bonded to the epitaxial layers and substrate at the wafer-level and is used as a rigid carrier for subsequent process steps including substrate thinning Bonding the coverglass at the wafer level eliminates the need to apply coverglass to each individual photovoltaic cell during CIC manufacturing. Use of the coverglass as a wafer carrier also facilitates the use of low cost etch and via deposition processes to provide all-backside electrical contacts for surface mounting. The surface mount photovoltaic cells can be assembled onto a circuit board using high speed pick-and-place equipment and methods.

Figure 31:
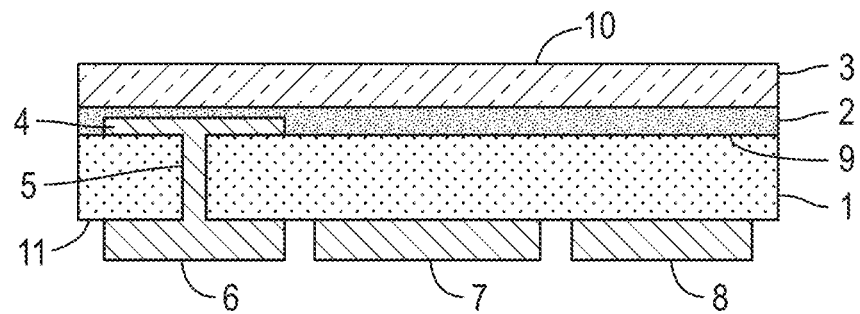
FIG. 31 shows a cross-section view of an example of a surface mount multijunction photovoltaic cell according to the invention.

FIG. 31 shows a cross-sectional schematic view of an example of a SMCC device provided by the present disclosure. The SMCC shown in FIG. 31 includes semiconductor 1, which includes heteroepitaxial layers overlying a substrate, and a coverglass 3, bonded to the front surface 9 of the semiconductor 1 using an optical adhesive 2. Front side contact 4 on front surface 9 of semiconductor 1 is interconnected to back surface contact pad 6 by through-wafer-via (TWV) 5. Back surface contact pad 6 and TWV 5 are electrically insulated from semiconductor 1. Back surface 11 of semiconductor 1 is interconnected to back surface contact 7. Surface mount solder pad 8 is disposed on and electrically insulated from back surface 11 and is electrically interconnected (not shown) to back surface contact 7.

When referring to the various surfaces of a multijunction solar cell, the front surface or top surface refers to the surface designed to face incident solar radiation, and the back surface or bottom surface refers to the side of the solar cell facing away from the incident radiation. The front surface is also referred to as the frontside surface, and the back surface is also referred to as the backside surface.

Figure 32:
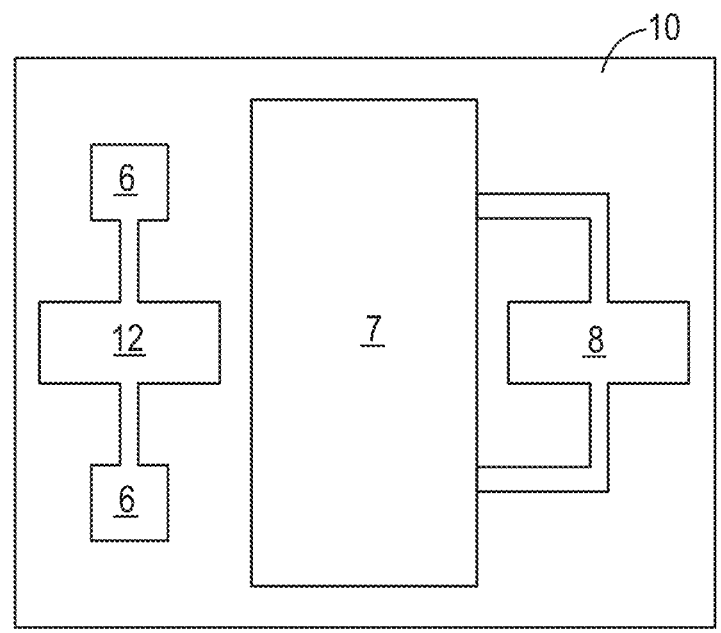
FIG. 32 shows a bottom view of an example of a surface mount multijunction photovoltaic cell according to the invention.

FIG. 32 shows a back surface view of the SMCC device shown in FIG. 31. Back surface contact pads 6 are interconnected to the front side contact (not shown) of the semiconductor. Back surface contact pads 6 are interconnected to front side surface mount solder pad 12 for interconnecting the SMCC device to a printed circuit board or other interconnection substrate. Back surface contact 7 is disposed on the back surface 10 of the SMCC device and is interconnected to back surface mount solder pad 8 for interconnecting the SMCC device to a printed circuit board.

The coverglass 3 (FIG. 31) can be any suitable optically transparent dielectric material appropriate for use in solar cells. The coverglass can be a sheet of material. In certain embodiments, the coverglass is radiation resistant. The coverglass can be any suitable thickness for protecting the solar cell from the environment and radiation. For example, the coverglass can be from 20 μm to 600 μm thick, from 40 μm to 500 μm thick, from 50 μm to 400 μm thick, or from 75 μm to 300 μm thick.

The optical adhesive 2 (FIG. 31) can be any suitable optical adhesive capable of bonding the coverglass to underlying layers including a heteroepitaxial layer and/or metal contact layers. An example of a suitable optical adhesive is Dow Corning® 93-500 space grade encapsulant. The optical adhesive layer can be, for example, from 2 μm to 200 μm thick, from 5 μm to 150 μm thick, or from 10 μm to 100 μm thick.

Front side contact 4 (FIG. 31) can comprise one or more layers and can be, for example, less than 0.2 μm thick, less than 10 μm thick, less than 20 μm thick, or less than 40 μm thick. Thicker front contact layers can comprise multiple layers such as, for example, layers of Au, Ag Ti, Ni, Cr, or combinations of any of the foregoing. Each layer can be, for example, from 1 μm to 10 μm thick, or from 0.1 μm to 1 μm thick.

Semiconductor layer 1 (FIG. 31) can comprise a heteroepitaxial layer on a substrate. Semiconductor layer 1 comprises the active multijunction photovoltaic cell. The multijunction photovoltaic cells can comprise one or more subcells. Examples of multijunction photovoltaic cells are disclosed in U.S. Application No. 62/350,430 filed on Jun. 15, 2016, U.S. application Ser. No. 14/887,021 filed on Oct. 19, 2015, U.S. Application Publication No. 2013/0118566, and U.S. Application Publication No. 2013/0130431, each of which is incorporated by reference in its entirety. The heteroepitaxial layer can include multiple layers of semiconductor material used to fabricate a multijunction photovoltaic cell such as shown in FIG. 1. In certain multijunction photovoltaic cells, at least one of the junctions comprises a dilute nitride material such as GaInNAsSb, GaInNAsBi, or GaInNAsSbBi. In certain embodiments, each of the subcells is lattice matched to each of the other subcells forming the multijunction photovoltaic cell and to the substrate. A substrate can be active and comprise one of the active junctions of the photovoltaic cell, or the substrate can be inactive. An example of an active substrate is Ge. A Ge substrate can be less than 200 um thick, less than 175 um thick, less than 150 um thick, or less than 100 um thick. A Ge substrate can be, for example, from 20 μm to 175 μm thick, from 50 μm to 175 μm thick, or from 50 μm to 80 μm thick. An example of an inactive substrate is GaAs, which can be, for example, from 10 μm to 400 μm, from 40 μm to 90 μm, from 50 μm to 80 μm, or from 50 μm to 70 μm thick.

Backside contact 6 (FIG. 31 and FIG. 32) can include one or more layers of electrically conductive metals such as Au, Ag, Ti, Ni, Cr, or a combination of any of the foregoing. The contact layer 6 can be, for example, less than 0.2 μm thick, less than 0.5 μm thick, or less than 1 μm thick, and each of the electrically conductive layers can be, for example, from 0.1 μm to 1 μm thick, from 1 μm to 20 μm thick, or from 1 μm to 10 μm thick.

Figure 33:
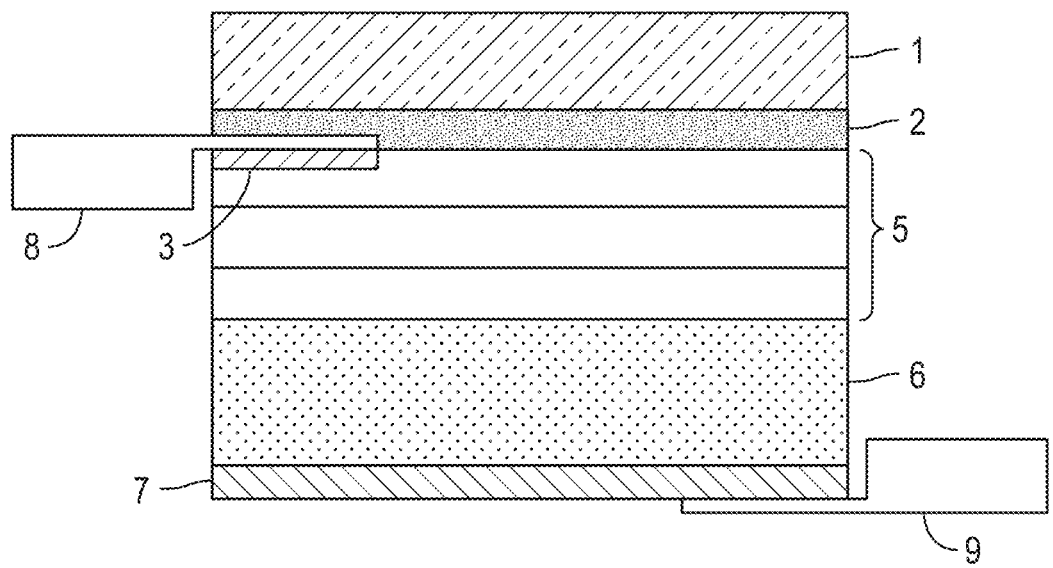
FIG. 33 shows a cross-section view of a coverglass interconnect cell (CIC).

FIG. 33 shows a cross-section view of an example of a conventional coverglass interconnect cell (CIC). The CIC shown in FIG. 33 includes a coverglass 1 bonded to heteroepitaxial layer 5 with optical adhesive 2. However, heteroepitaxial layers 5 overly substrate 6. Front side contact 3 interconnects to the front surface of heteroepitaxial layer 5, and back side contact 7 interconnects to the back surface of substrate 6. Interconnection tabs 8 and 9 are welded to front side contact 3 and back side contact 7, respectively.

Figure 34:
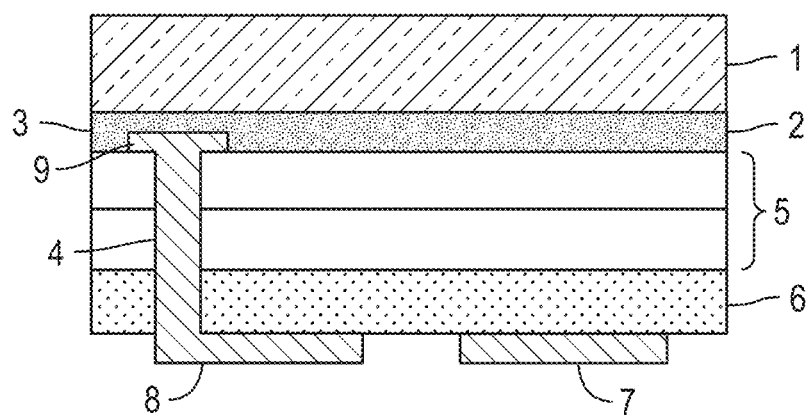
FIG. 34 shows a cross-section view of an example of a surface mount coverglass cell (SMCC) according to the invention.

FIG. 34 shows a cross-section view of an example of a surface mount coverglass cell (SMCC) provided by the present disclosure. The SMCC device includes coverglass 1 bonded to the front surface of heteroepitaxial layer 5 with optical adhesive 2. Heteroepitaxial layers 5 overly substrate 6. Substrate 6 can be a thinned substrate. Front side contact 9 is interconnected to the front surface of heteroepitaxial layers 5. Front side contact 9 is interconnected to contact 8 on the back side surface of the device by TWV 4. Back surface contact 7 underlies and is interconnected to substrate 6. It can be appreciated that many details of a SMCC are not shown in FIG. 34.

As illustrated by comparing the CIC device shown in FIG. 33 with the SMCC device shown in FIG. 34, the substrate in the SMCC can be much thinner than the substrate in the CIC. Also, because the SMCC solder pads in FIG. 34 are amendable to surface mount assembly, the welded interconnect tabs shown in FIG. 33 are not necessary.

Figure 35C:
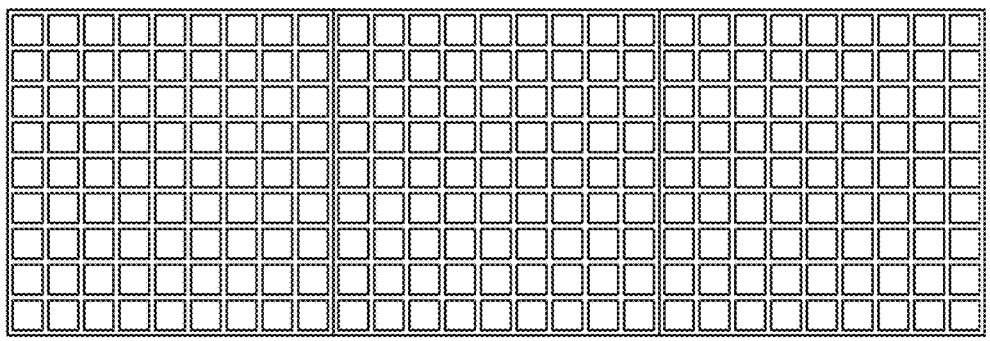
FIGS. 35A-35C show solar cell panel utilization using full wafers (35A), half wafers (35B), and SMCCs provided by the present disclosure (35C).
Figure 35B:
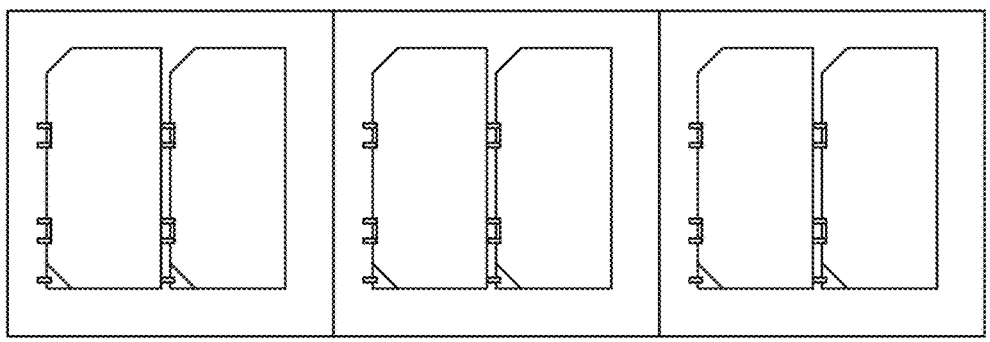
Figure 35A:
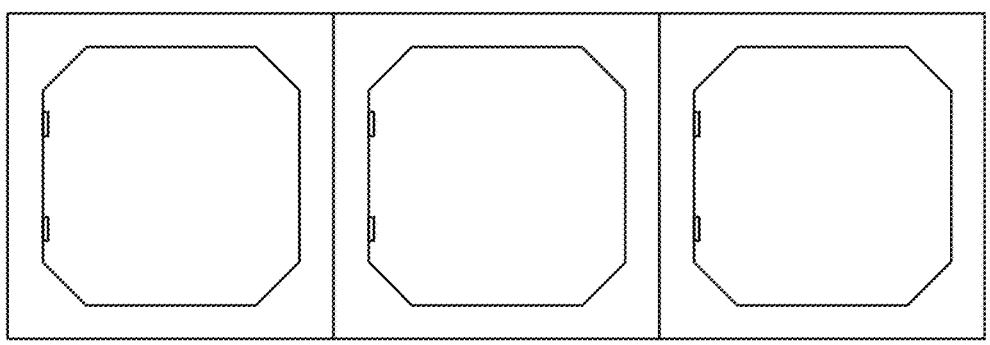

FIGS. 35A-35C show top views of three different solar cell panels. The mount area is 100 cm$^2$. FIG. 35A shows the area covered by three 59.42-cm$^2$ photovoltaic cells with a surface utilization of 59.42%. FIG. 35B shows the area covered by six 29.95-cm$^2$ photovoltaic cells with a surface utilization of 59.49%. FIG. 35C shows the area covered by 243, 1-cm$^2$ SMCC photovoltaic cells corresponding to a surface utilization of 81%.

Using the smaller, surface mountable SMCC devices (FIG. 35C), a solar panel can be tiled to fill the panel with little area between adjoining cells. The wafer is also more efficiently utilized. Using CICs (FIGS. 35A and 35B), there is significant wasted space between adjacent cells in part due to the welded interconnection tabs. Because of the high cost associated with welded interconnects it is desirable to reduce the number of interconnections in a solar cell array. This can be accomplished by using larger photovoltaic cells. Although the use of larger photovoltaic cells reduces the number of interconnects between photovoltaic cells, the panel area utilization is reduced. FIG. 35C shows the high panel utilization provided by assembling SMCCs onto a panel with little separation between adjacent photovoltaic cells. FIG. 35B shows panel tiling using half-wafer sections with area between adjacent photovoltaic cells required for welded tab interconnects. It can be appreciated that using, for example, quarter-wafer photovoltaic cells will increase the number of welded tab interconnects and also reduce the panel utilization.

Using through-wafer-vias, the coverglass can be applied to the front surface of the photovoltaic cells at the wafer-level. The coverglass can be used as a carrier to thin the semiconductor substrate. For example, the epitaxial layers of a multijunction solar cell can be grown on a thick substrate such as a 140 μm thick Ge substrate as is usually the case for conventional three junction space cells. The thickness of the substrate can be reduced, for example, from 140 μm to 50 μm for Ge, and down to as thin as 10 μm for GaAs substrates. As an example, a SMCC with a solar cell on a GaAs substrate thinned-down to 50 μm, results in a 43% reduction in the mass of the photovoltaic cell, relative to a conventional cell on a 140 μm-thick Ge substrate. For a satellite with a 550 W BOL power requirement, replacing conventional CICs with SMCC devices provided by the present disclosure can reduce the mass by over 0.75 kg.

The fabrication of SMCC multijunction photovoltaic cells includes forming high quality through-wafer-vias (TWVs) across the complex heteroepitaxial structure.

Conventional multijunction solar cells have been widely used for terrestrial and space applications because of their high efficiency. Multijunction solar cells (100), as shown in FIG. 1, include multiple diodes in series connection, known in the art as junctions or subcells (106, 107, and 108), realized by growing thin regions of epitaxy in stacks on semiconductor substrates. Each subcell in a stack possesses a unique bandgap and is optimized for absorbing a different portion of the solar spectrum, thereby improving efficiency of solar energy conversion. These subcells are chosen from a variety of semiconductor materials with different optical and electrical properties in order to absorb different portions of the solar spectrum. The materials are arranged such that the bandgap of the subcells becomes progressively narrower from the top subcell (106) to the bottom subcell (108). Thus, high-energy photons are absorbed in the top subcell and less energetic photons pass through to the lower subcells where they are absorbed. In every subcell, electron-hole pairs are generated and current is collected at ohmic contacts in the solar cell. Semiconductor materials used to form the subcells include, for example, germanium and alloys of one or more elements from group III and group V on the periodic table. Examples of these alloys include, for example, indium gallium phosphide, indium phosphide, gallium arsenide, aluminum gallium arsenide, indium gallium arsenide, and dilute nitride compounds. For ternary, quaternary, and quinary compound semiconductors, a wide range of alloy ratios can be used.

Solar cells are manufactured on a wafer scale using conventional semiconductor processing methods known to practitioners skilled in the art. Danzilio (CS MANTECH Conference, May 14-17, 2007 Austin, Tex., pp. 11-14) summarizes the processing steps for making a typical multijunction solar cell.

Figure 2A:
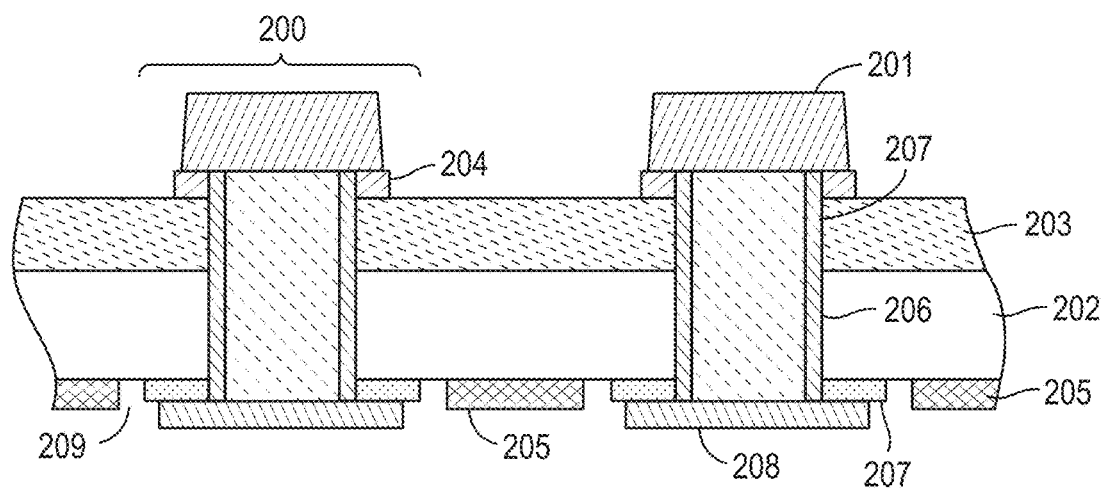
FIG. 2A shows a cross-section of a multijunction photovoltaic cell with TWVs fabricated by dry etching.
Figure 2B:
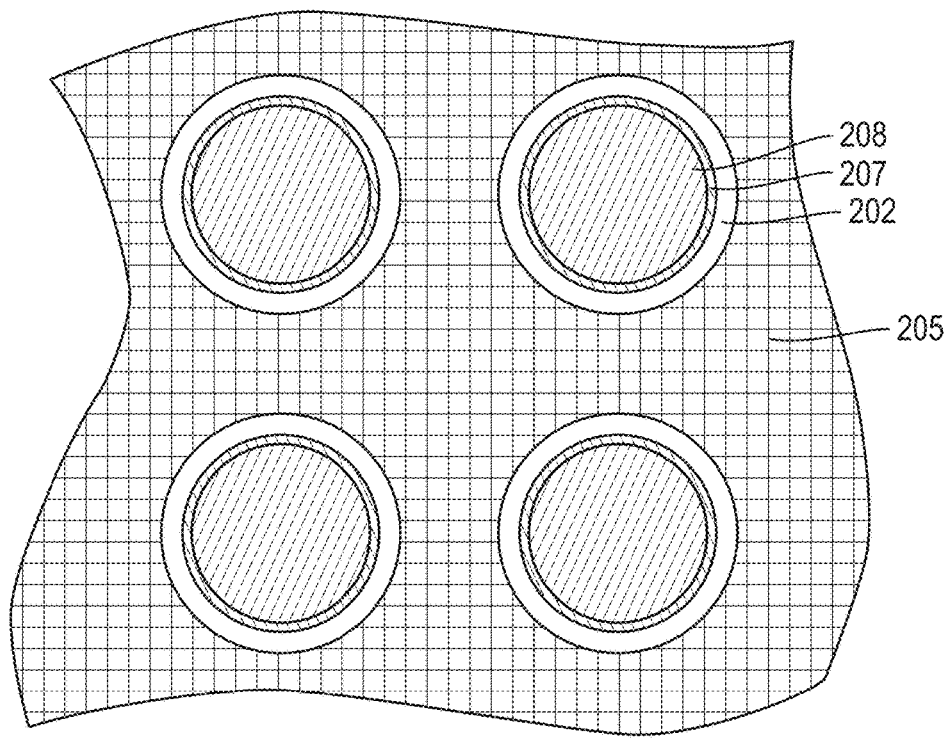
FIG. 2B shows a bottom view of the multijunction photovoltaic cell shown in FIG. 2A.
Figure 3A:
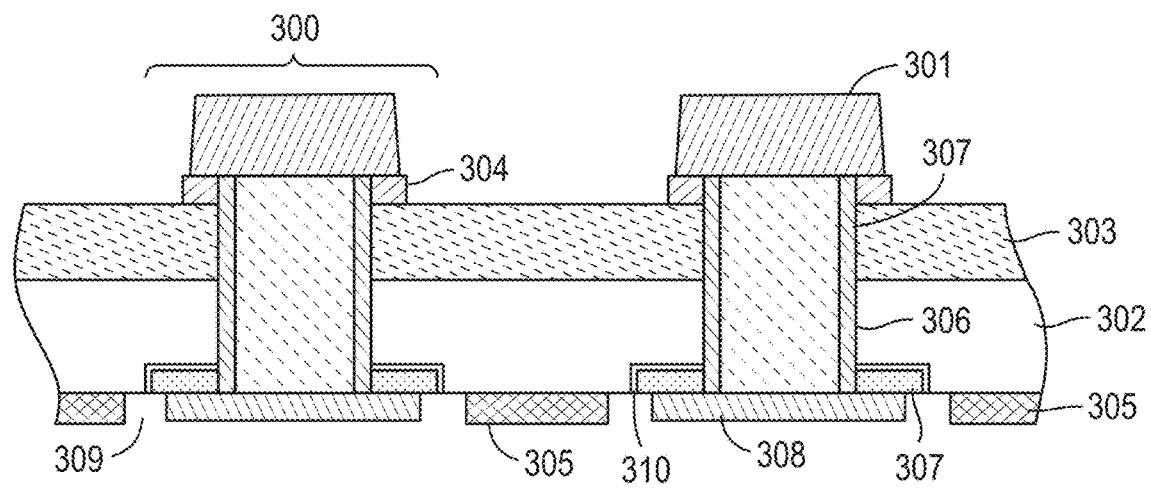
FIG. 3A shows a cross-section of a multijunction photovoltaic cell with TWVs fabricated by dry etching.
Figure 3B:
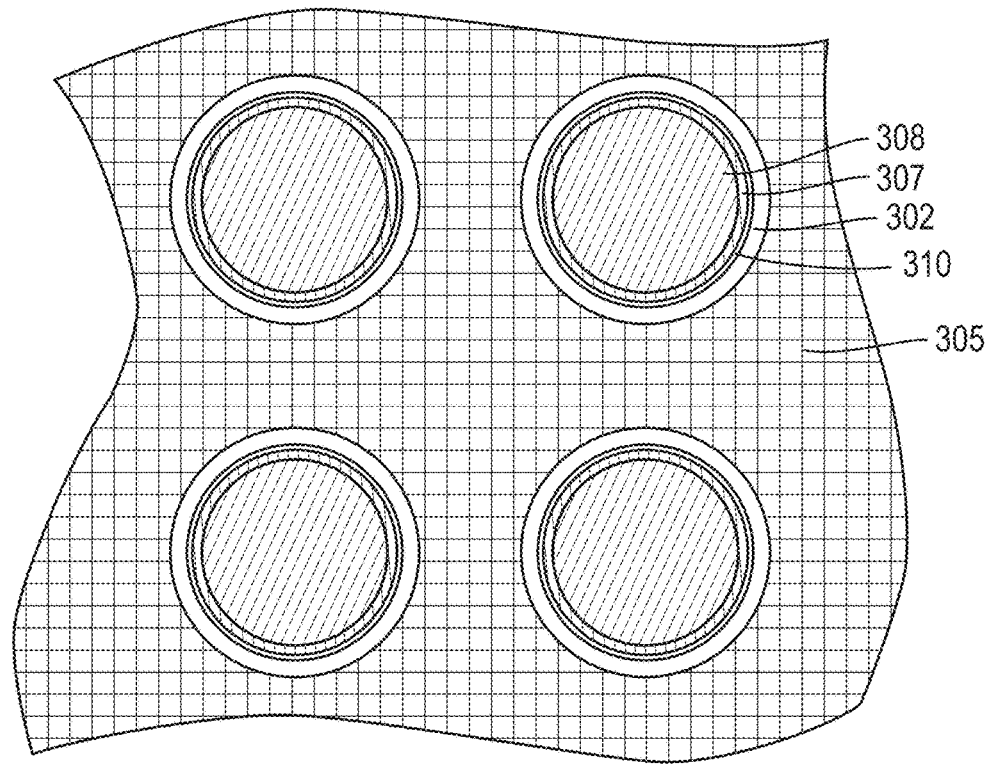
FIG. 3B shows a bottom view of the multijunction photovoltaic cell shown in FIG. 3A.

A through-wafer via (TWV) is an electrical interconnect between the top (front) and bottom (back) surfaces of a semiconductor chip. TWVs are routinely used for a variety of applications in the field of semiconductor devices including photovoltaic cells. FIG. 2A and FIG. 3A show examples of TWVs (200 and 300) for photovoltaic cells with front and back electrical contacts. TWVs are electrically isolated from the photovoltaic cell substrate (202 and 302) and all the epitaxial regions (203 and 303), and are electrically connected to the patterned cap regions (204 and 304). The patterned cap regions are patterned such that they surround the TWV structures on the top surface of the photovoltaic cell. Front side metal pads (201 and 301) lay over patterned cap regions (204 and 304). TWVs also comprise back side metal (205 and 305), via metal (206 and 306), passivation layer (207 and 307), via contact metal region (208 and 308) and gap (209 and 309) between passivation layer 207 and back side metal 205. In some examples of TWVs, a recess structure 310 is present in the TWV design. Methods to fabricate TWVs are known to practitioners skilled in the art of semiconductor fabrication. For example, Chen et al. (Journal of Vacuum Science and Technology B, 27(5), p. 2166, 2009) disclose a semiconductor device with TWVs for a high mobility electron transport device application.

TWVs are also used to provide back-contact packaging in photovoltaic cells. Back-contact cells have both positive and negative external contact pads disposed on the back surface, which allows for optimized module efficiency by increasing the packing density of solar cells. Shading losses and resistive losses are also significantly reduced. Van Kerschaver et al. (Progress in Photovoltaics: Research and Applications 2006; 14:107-123) summarizes several approaches for back-contact solar cells.

Figure 4A:
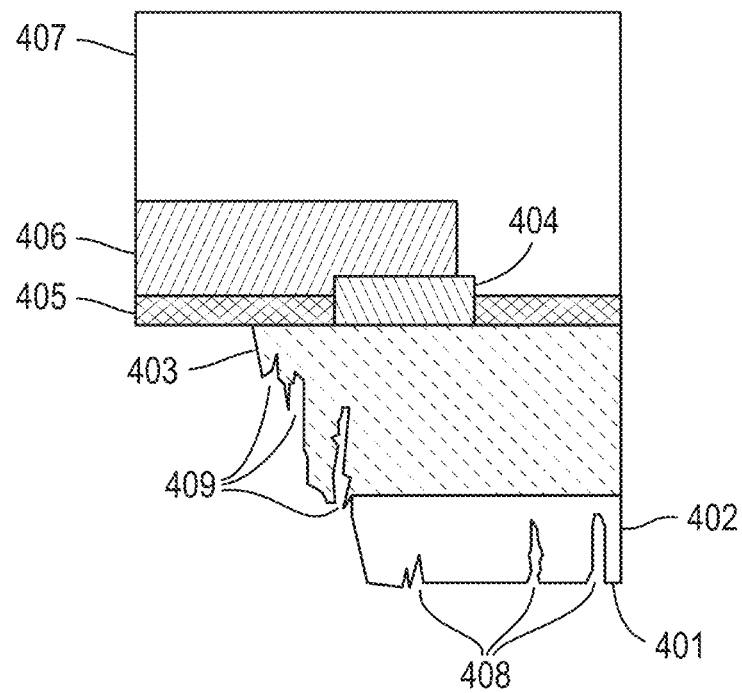
FIG. 4A shows a schematic cross-section of a multijunction solar cell semiconductor wafer representative of a scanning electron microscopy image illustrating wafer damage caused using dry etch methods.

Dry etching is a routine method used in semiconductor fabrication but has found limited use in solar cell manufacturing. Dry etching involves the removal of semiconductor material by exposing the material to a plasma of reactive gases in a vacuum chamber. Dry etching of heteroepitaxial layers in multijunction photovoltaic cells involves added complexity because each class of semiconductor material requires a unique etch condition. This complexity causes a slower net etch rate and a bottleneck in manufacturing. As etching proceeds across multiple layers of heterogeneous semiconductor materials, re-deposition of etched-off material causes rough sidewalls and is unavoidable. A mask is used to protect wafer areas where etching is not required. A photosensitive polymer is typically used as the mask, but a photosensitive polymer mask cannot withstand the long etch times and high heat required for dry etching. The photosensitive polymer mask is often destroyed, leading to pitting and significantly to the generation of rough surfaces, which complicates subsequent sidewall passivation processing and decreases reliability of manufactured devices. FIG. 4A depicts a schematic of a wafer cross-section imaged by scanning electron microscopy, damaged with pitting and rough sidewall surfaces (408 and 409). The device shown in FIG. 4A includes coverglass 407, front side metal pad 406, ARC 405, heteroepitaxial layer 403, substrate 402, patterned cap region 404, and back side 401 of substrate 402. The sidewall 409 of heteroepitaxial layer 403 is characterized by a rough surface including pitting and/or undercutting resulting from the dry etch. Pitting 408 is also shown on the back side surface 401 of substrate 402, which can also be caused by the dry etch. Alternative masking methods such as dielectric hard masks can be used in place of a photosensitive polymer, but these masks require elaborate downstream steps for removal from the wafer. Dry etching also involves expensive equipment setup and maintenance. In summary, dry etching presents the following complications:

(1) electroplating or electrografting to protect wafer areas where etching is not desired, requiring expensive and specific equipment;

(2) low processing throughput and longer processing time because dry etching can be carried out on only a few wafers at a time;

(3) difficulty in controlling etch rate as well as etch stop, leading to insufficient etching or over-etching;

(4) uneven etching of heteroepitaxial III-V semiconductor layers results in pitting and rough sidewall surfaces, which complicate subsequent sidewall passivation;

(5) higher possibility of device failure due to insufficient sidewall passivation;

(6) more chemical, water, and energy consumption during fabrication; and (7) higher cost from equipment procurement and maintenance Wet etching, another method for removing semiconductor material by using chemicals in liquid phase, is not without shortcomings. Typically, wet etchants used for etching one class of semiconductor materials is selective and will not etch certain other classes of semiconductor materials. A comprehensive list of wet etchants, etch rates and selectivity relationships was published by Clawson, Materials Science and Engineering, 31 (2001) 1-438. The selectivity of a wet etchant may also depend on alloy concentration of the compounds. Consequently, etching heteroepitaxial layers can require application of multiple wet etch chemistries. Using multiple applications of different selective wet etchants typically results in jagged, non-smooth, and/or irregular TWV sidewalls (as shown in FIG. 4A). This is observed in photovoltaic cell fabrication where different etch chemistries are used for each class of semiconductor material in the heteroepitaxial layers, resulting in distinctively different etch profiles and rough sidewall surfaces throughout the wafer. Zaknoune et al., J. Vac. Sci. Technol. B 16, 223 (1998) reported a wet etching method that is nonselective for III-V phosphides and arsenides as an alternative to using multiple wet etchants. Although the method is nonselective, the etching of gallium arsenide results in very rough morphology and involves an etch rate 10 times faster than the etch rate of aluminum gallium indium phosphide. Zaknoune et al. describe a system with one layer of epitaxy, such as that found in heterojunction bipolar transistors (HBT), quantum well lasers (QWL) and high electron mobility transistors (HEMT). The Zaknoune et al. method does not address any sidewall problem related to heteroepitaxial layers that is characteristic of multijunction solar cells.

Typically, rough/jagged TWV sidewalls complicate subsequent sidewall passivation, leading to an increase in device failures and lower fabrication yield. In addition, the use of multiple etchants has other disadvantages compared to single-etch chemistries, including, for example:

(1) increased difficulty in controlling the etch rate and undesirable lateral undercutting of layers;

(2) uneven etching of different semiconductor layers and increased difficulty in subsequent sidewall passivation processing;

(3) higher possibility of device failure due to insufficient sidewall passivation;

(4) longer processing time due to complications and unpredictability inherent in the method;

(5) more chemical, water, and energy consumption during fabrication; and (6) more chemical waste generation.

The abovementioned conventional processes have hindered cost-effective fabrication of multijunction photovoltaic cells. There were attempts to explore non-selective etchants and certain examples are briefly described. Zaknoune et al. (J. Vac. Sci. Technol. B 16, 223, 1998) report an etching procedure that is nonselective for gallium arsenide and aluminum gallium indium phosphide, where the aluminum gallium indium phosphide quaternary compound has 35% aluminum phosphide, 15% gallium phosphide, and 50% indium phosphide. The etching procedure described by Zaknoune et al. uses a diluted solution of hydrochloric acid, iodic acid, and water to etch 300 nm of the quaternary compound grown on a gallium arsenide substrate using a photosensitive polymer mask. The main application areas described in the paper by Zaknoune et al. are heterojunction bipolar transistors (HBT), various quantum well lasers (QWL), and high electron mobility transistors (HEMT) for which large conduction and valance band discontinuities are required. These devices are majority carrier devices in which the large bandgap materials are typically used as barrier materials for majority carriers. Zaknoune et al. describe a system with one layer of epitaxy and do not recognize any sidewall problem related to multilayer epitaxy that is characteristic of photovoltaic cells.

The device requirements for multijunction solar cells are significantly different than for HBTs, QWLs, and HEMTs, largely because multijunction photovoltaic cells are minority carrier devices. Consequently the procedure described by Zahnoune et al. has no direct application to etching multijunction solar cell structures, which include a wide variety of semiconductor materials with a wide range of bandgaps (for example, from 0.67 eV to 2.25 eV).

The present disclosure describes a TWV fabrication method that overcomes complications with existing methods. The various advantages include the following:

(1) when anti-reflective coating (ARC) is deposited, as part of routine solar cell fabrication, a pattern is added where the TWV is to be constructed, i.e. the ARC is used as a dielectric etch stop between the semiconductor and the metal pads on top of the wafer. This additional function of the ARC simplifies TWV fabrication by eliminating the application of an extra etch stop;

(2) standard manufacturing processing steps are employed, including photolithography, wet etching and thin film evaporation;

(3) significant cost reduction due to the use of inexpensive equipment, chemicals and methods;

(4) processing throughput is higher because multiple wafers can be etched at the same time and fewer etching process steps are required;

(5) areas of wafer that need to be protected from etching can be protected by a photosensitive polymer, employing a lower cost material and simpler method than electroplating photoresist or electrografting;

(6) smooth, 100% passivated TWV walls, which improves manufacturing yield by lowering the risk of device failure; and (7) a thinner substrate results from these processing steps, making the photovoltaic cells lighter and appropriate for space applications, simplifies fabrication of the TWV, and improves thermal properties.

U.S. Application Publication No. 2015/0349181 to Fidaner et al. discloses a method of etching mesa sidewalls in multijunction photovoltaic cells using a single-step wet etch process, where the etchant comprises a mixture of hydrochloric acid and iodic acid, which is incorporated by reference in its entirety. Fidaner demonstrates that the iodic etchant can be used to etch heteroepitaxial layers such as characteristic of multijunction photovoltaic cells having smooth sidewalls.

A wet etchant used to etch the TWVs can comprise iodic acid, hydrochloric acid, and water prepared in the molar ratios of 1:62:760, respectively. The molar ratios of iodic acid and hydrochloric acid can be within, for example, a variance of ±5%, such that the molar ratios in the mixture are within the ranges (0.95-1.05): (59-65): 760, for iodic acid, hydrochloric acid, and water, respectively. The molar ratios of iodic acid and hydrochloric acid can be within, for example, a variance of ±10%, such that the molar ratios in the mixture are within the ranges (0.90-1.10): (56-68): 760, for iodic acid, hydrochloric acid, and water, respectively. The molar ratios of iodic acid and hydrochloric acid can be within, for example, a variance of ±15%, such that the molar ratios in the mixture are within the ranges (0.85-1.15): (53-71): 760, for iodic acid, hydrochloric acid, and water, respectively.

In terms of vol %, the iodic acid, hydrochloric acid and water can be combined in a 1:2:3 ratio by volume, wherein the aqueous solution of hydrochloric acid can be 38%±3% by weight and the aqueous solution of iodic acid can be 6.6%±1% by weight. The aqueous solution of hydrochloric acid can be 38%±6% by weight and the aqueous solution of iodic acid can be 6.6%±5% by weight. It is within the contemplation of the invention to use another solute or liquid mixtures besides water in the wet etch process, although water is the most readily available. Similarly, other acids of different molar concentration can be substituted for hydrochloric acid to yield the same result.

The wet etch results cross-sectional shape of the side wall profile characterized by a substantially macroscopically smooth curved profile, that is, having a substantially macroscopically smooth surface without significant undercutting of a junction region compared to other junction regions.

The wet etchant can comprise a volumetric ratio of hydrochloric acid from 10%-50% and the volumetric ratio of iodic acid in the mixture can be 10%-50%, where the aqueous solution of hydrochloric acid is 38%±3% by weight and the aqueous solution of iodic acid can be 6.6%±1.0% by weight, or 38%±5% by weight and the aqueous solution of iodic acid is 6.6%±5.0% by weight. It is to be understood the same molar ratios of the constituent chemicals can be provided using different volumetric ratios with different molarities in the aqueous solutions used. During processing, the temperature of the wet etchant can be maintained between 10° C. and 140° C., such as, for example, from 20° C. to 100° C., from 20° C. to 60° C., or from 30° C. to 50° C.

A wet etchant can comprise volumetric ratio of hydrochloric acid from 30% to 35% and a volumetric ratio of iodic acid from 14% to 19%, using the molarities in the aqueous solutions of the constituent chemicals, and the temperature of the mixture can be maintained between 30° C. and 45° C. A wet etchant can comprise volumetric ratio of hydrochloric acid from 27% to 38% and a volumetric ratio of iodic acid from 11% to 22%, using the molarities in the aqueous solutions of the constituent chemicals, and the temperature of the mixture can be maintained between 30° C. and 45° C.

Single step wet etch processes are described to produce semiconductor devices that have back contacts, i.e. electrical contacts on the back side of the device, that can be employed to provide a SMCC. Specifically, TWVs for back-contact multijunction solar cells are fabricated with this wet etch method. TWVs are fabricated that are electrically isolated from the photovoltaic cell substrate and all epitaxial regions, except for the patterned cap regions. The method of wet etch chemistry employed removing semiconductor materials non-selectively without major differences in etch rates between different heteroepitaxial layers. This is useful for multijunction photovoltaic cells, which comprise multiple heterogeneous semiconductor layers epitaxially grown on the semiconductor substrate. Multijunction solar cells thus formed lack pitting on the wafer surfaces and on the TWV sidewalls, and have smooth sidewall surfaces within the TWVs. This process employs standard wafer batch processing, significantly reduces fabrication complexity and cost, increases processing throughput, and improves device performance and reliability by ensuring complete passivation of TWV walls.

The process steps described herein can be modified or adapted provided that the removal of semiconductor material in exposed areas is achieved using a single-step wet etch process. It is to be understood that additional process steps can be inserted in all semiconductor processes that require TWV fabrication.

In certain aspects of the invention, TWVs can be etched from the back side of a semiconductor wafer. The semiconductor wafer has front side metal pads, patterned cap regions, metal regions that lay over each patterned cap region, and an ARC that result from front side wafer processing. The front side of the semiconductor wafer can also be bonded to coverglass with an optically clear adhesive. The semiconductor can be thinned from its back side. TWV holes can be etched from the back side of the semiconductor wafer so that the TWVs extend from the back side surface of the semiconductor wafer to the ARC overlying the top of the heteroepitaxial layer. Wafer areas, where etching is not desired, can be protected by resist patterns. Then, multiple layers of semiconductor material can be wet etched where TWVs are desired; etching can be carried out in a single step with wet chemistry that may comprise the use of an iodic acid-hydrochloric acid mixture. The ARC can serve as a dielectric etch stop and can protect the front side metal pad from being etched. The ARC can then be removed to expose the bottom side of the front metal pads. A passivation layer can subsequently be deposited over the smooth TWV sidewalls. This can be followed by the deposition of a metal isolation resist pattern, protecting semiconductor wafer areas where metal is not required. Then, metal can be deposited on the bottom of the TWV and on the sidewalls of the TWV and on the back side of the wafer. Finally, the metal isolation resist pattern and sacrificial metal can be removed.

In another aspect of the invention, TWVs can be etched from the front side of a semiconductor wafer. The semiconductor wafer has a cap layer overlying the heteroepitaxial layer. TWV holes can be etched from the front side of the semiconductor wafer into the substrate layer using a single-step wet chemistry that may include the use of an iodic acid-hydrochloric acid mixture. Wafer areas where etching is not desired can be protected by resist patterns. Then, patterned cap regions can be formed from the cap layer. ARC, which functions as a passivation layer, can be applied on the front side of the semiconductor wafer on regions surrounding the patterned cap regions as well as on the smooth surfaces of the TWV holes. The ARC that lines the bottom surface of TWV holes can be removed to expose the substrate. Then, metal can be deposited on the TWVs and on the front side of the semiconductor wafer, except on semiconductor wafer areas where metal is not desired and the semiconductor wafer can be protected by another resist pattern. This resist pattern can be removed and gold or other electrically conductive metal or alloy can be deposited to fill the TWVs. Gold can be deposited by electroplating. The semiconductor wafer can be mounted on coverglass with optically clear adhesive. Then, from the back side, the semiconductor wafer can be thinned and a passivation layer can be patterned onto this back side surface with a hard baking step. This can be followed by metal deposition, guided by a metal isolation resist pattern, on the back side of the semiconductor wafer. Finally, the metal isolation resist pattern and sacrificial metal can be removed.

Semiconductor devices formed using the single-step wet etch processes described lack pitting on the wafer surfaces as well as on the TWV sidewalls. Pitting morphology is typical if dry etching is employed to fabricate TWVs. The TWV sidewalls fabricated by this single-step wet etch method also have substantially smooth sidewall surfaces. Semiconductor devices formed by this method include back-contact-only multijunction photovoltaic cells.

Figure 28:
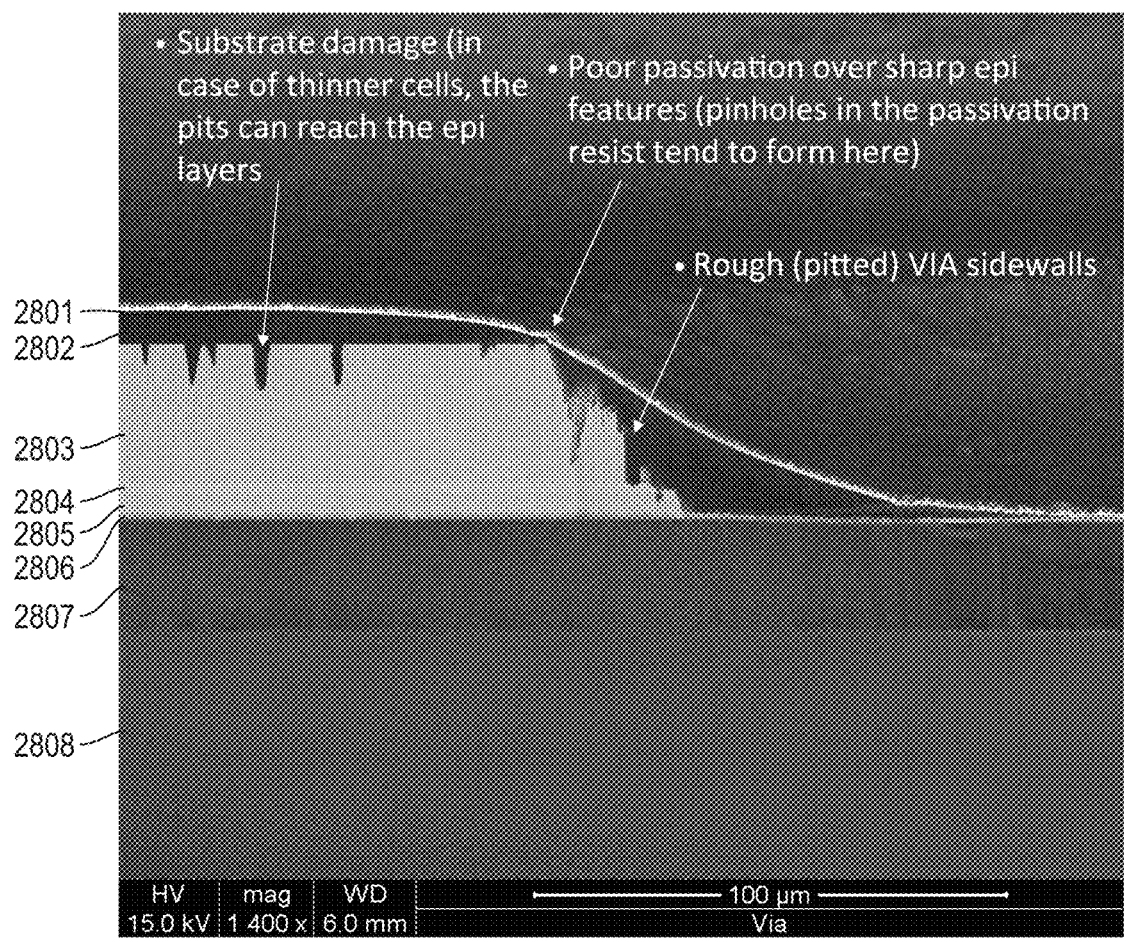
FIG. 28 shows a cross-sectional view of a multijunction photovoltaic cell with a TWV fabricated using a dry etch.

SEM (scanning electron microscopy) images showing cross-sections of TWVs fabricated using dry etch methods or fabricated using wet etch methods provided by the present disclosure are presented in FIGS. 28-30.

FIG. 28 shows a cross-section of a multijunction solar cell structure with a TWV fabricated using a dry etch process, including back side via metal 2801, passivation layer 2802, GaAs substrate 2803, bottom subcell 2804, middle subcell 2805, top subcell and contact layers 2806, adhesive 2807, and coverglass 2808. The surface of the GaAs substrate is characterized by pitting due to compromise of the etch mask. The side wall of the via is also rough and pitted. The rough surface results in the passivation layer that is applied to the side wall is not completely conformal. The purpose of the passivation layer is to electrically isolate the TWV metal from the semiconductor layers such as the substrate and the heteroepitaxial layers. A high quality passivation layer will be conformal to the underlying layer such as the substrate and the side wall of the TWV and will be free of pinholes. In FIG. 28 there is poor passivation over the sharp edges of the side walls and the pits in the substrate can reach the heteroepitaxial layers.

Figure 29A:
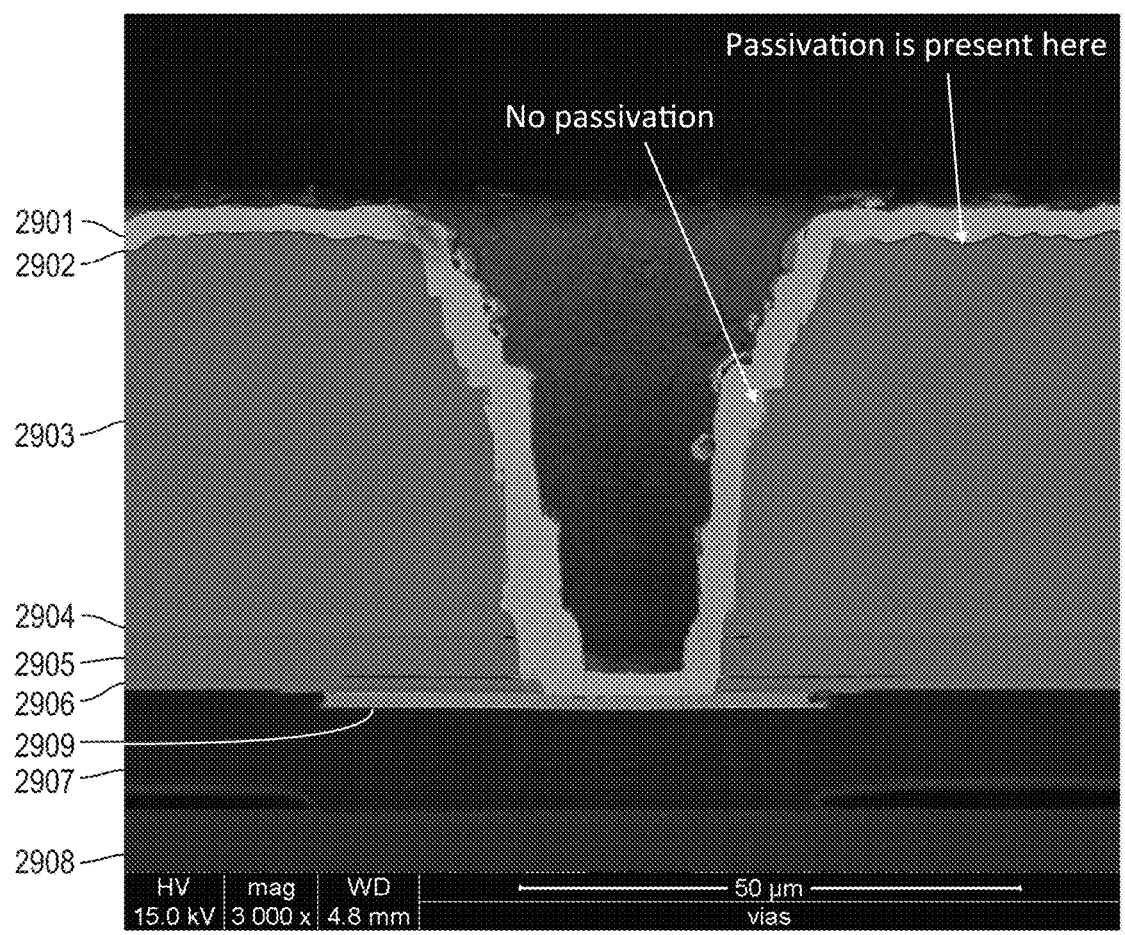
FIGS. 29A-29C show cross-sectional views of TWVs fabricated using a dry etch.
Figure 29B:
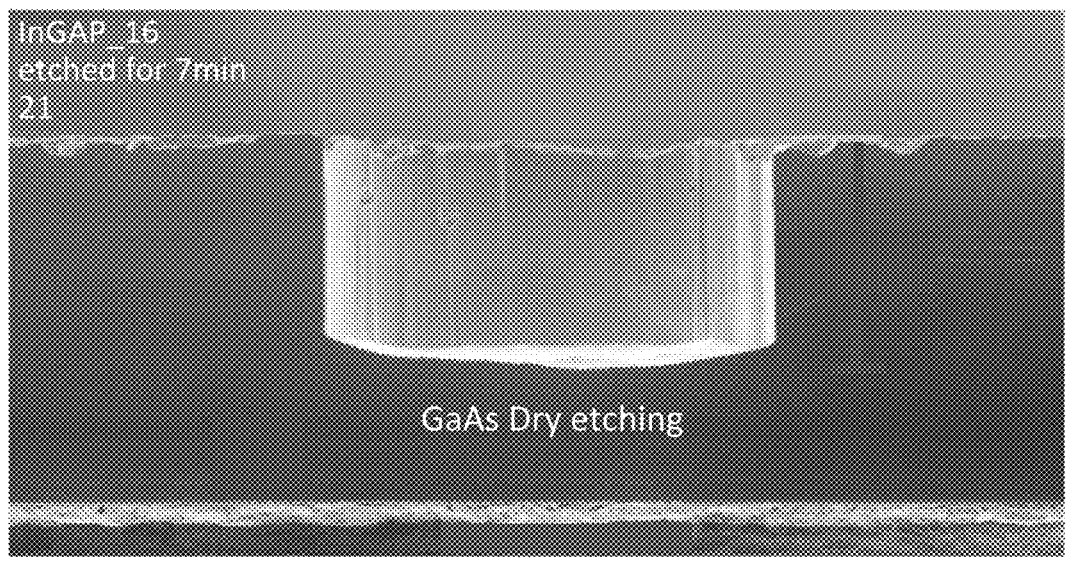
Figure 29C:
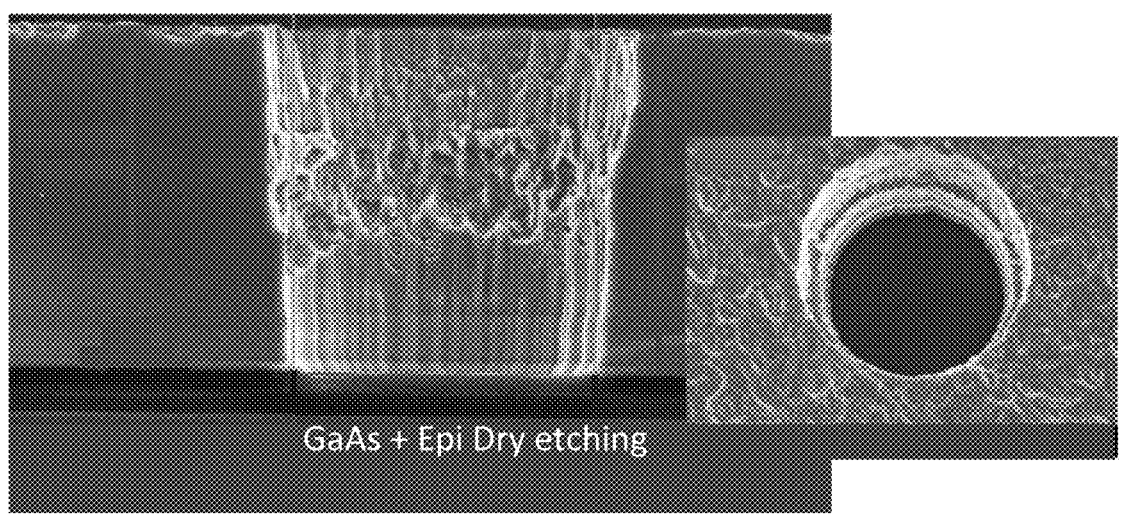

FIGS. 29A-29C also show cross-sections of TWVs fabricated using dry etch methods. FIG. 29A shows electroplated back side metal 2901, passivation layer 2902, GaAs substrate 2903, bottom subcell 2904, middle subcell 2905, top subcell and contact layers 2906, adhesive 2907, coverglass 2908, and top side metal pad 2909. There is no passivation on the rough side wall surfaces. FIG. 29B shows that dry etching can produce smooth side walls in a GaAs substrate; however, as shown in FIG. 29C, a dry etch of both GaAs and an overlying heteroepitaxial layer produces rough side wall surfaces that are difficult to passivate. FIG. 29C shows both a cross-sectional view and a top view of a TWV structure having both GaAs and heteroepitaxial layers.

For dry etch TWV structures, because the post-etch substrate and via wall topography is rough and/or pitted, the passivation layer coating quality is poor, especially around the via edges where the passivation thickness is less than 1 µm and there are a large number of pinholes in the passivation layer. These pinholes serve as a source for electrical shorting. Dry etching also generates etch mask residue such as burned resist that cannot be removed from the wafer without employing harsh cleaning and processing methods that can compromise the via structure. The burned resist results from the prolonged dry etch of the III-V heteroepitaxial stack and tends to accumulate around the TWV openings and also contributes to the formation of pinholes in the passivation coating.

Figure 30A:
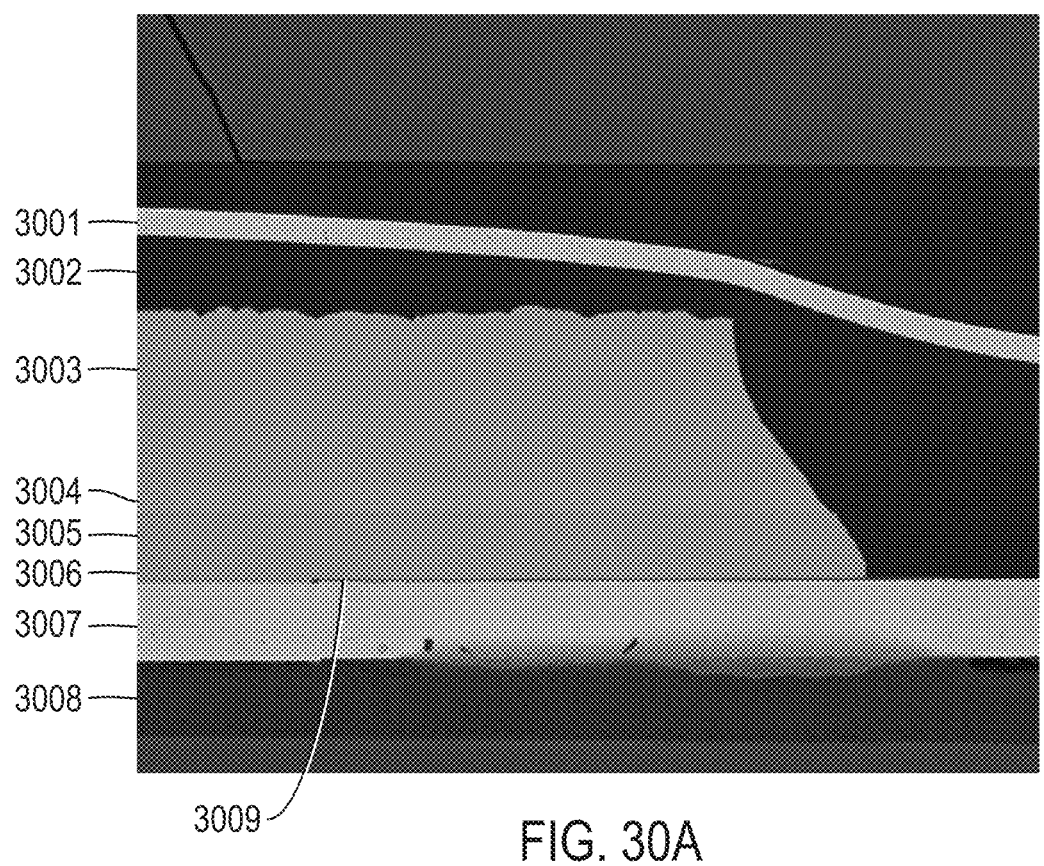
FIGS. 30A-30C show cross-sectional views of a multijunction photovoltaic cell with a TWV fabricated using a wet etch method provided by the present disclosure.
Figure 30B:
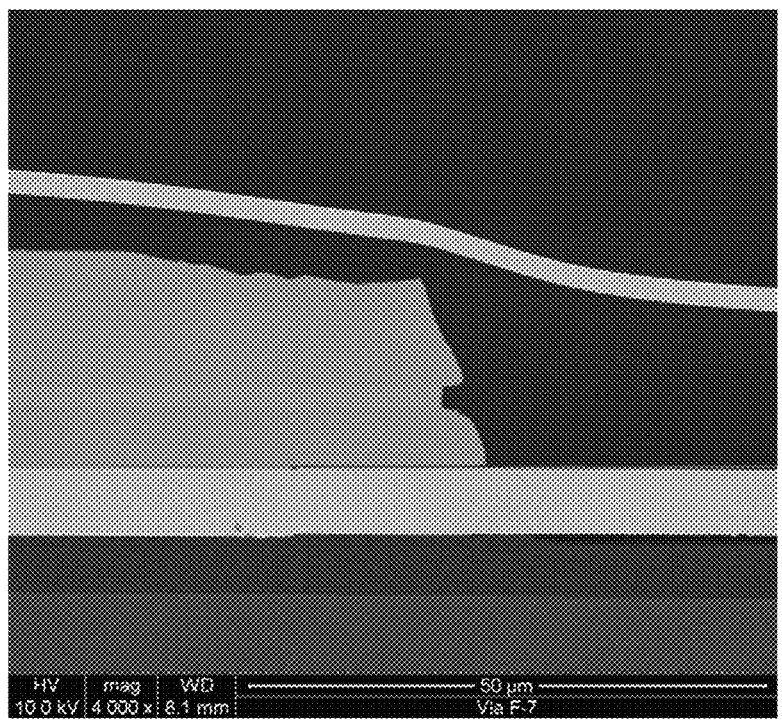
Figure 30C:
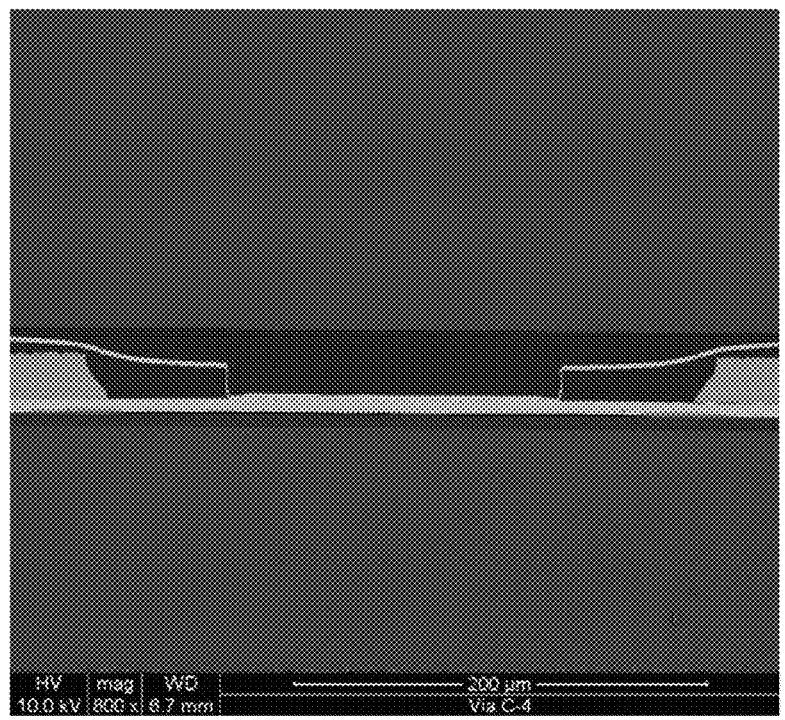

FIGS. 30A-30C show cross-sectional views of TWVs prepared using wet etch methods provided by the present disclosure. FIG. 30A shows deposited back side metal 3001, passivation layer 3002, GaAs substrate 3003, bottom subcell 3004, middle subcell 3005, top subcell and contact layers 3006, optically clear adhesive 3007, coverglass 3008, and ARC etch stop 3009. As shown in FIG. 30A, the top surface of the substrate and the side wall of the TWV are smooth and free of pitting and undercutting. The passivation layer conformably coats the surfaces that were etched using the iodic acid wet etch method provided by the present disclosure. The wet etched surfaces can comprise traces of iodine. FIG. 30B shows a cross-section with some lateral undercutting of the heteroepitaxial layer but with sufficiently smooth surfaces that the passivation layer conformally coats the side wall of the TWV. FIG. 30C shows another view of a TWV structure fabricated using the iodic acid wet etch method provided by the present disclosure. FIG. 30C also shows the bottom of the via metal in the TWV structure. The passivation thickness is 3 μm at the edges of the TWV. As shown in these figures, because the substrate and TWV surfaces are smooth and free of post-etch contamination, the passivation coating quality is high and is 100% conformal.

As shown in FIG. 1, multijunction photovoltaic cells 100 can include a substrate 5, back metal contact 52, top metal contact 2 including cap regions 3 and heteroepitaxial layers 45 forming the subcells. An ARC 1 overlies metal contact 2, cap regions 3, and the front surface of the uppermost subcell 106. The multijunction photovoltaic cell in FIG. 1 includes three subcells 106, 107, and 108. Each subcell can comprise a front surface field 4 and emitter 102 forming element 132, depletion region 103, base 104, back surface field 105, and tunnel junction 167. An ARC can cover the top surface of the multijunction solar cell. Tunnel junction 178 interconnects second subcell 107 and third subcell 108. Heteroepitaxial layers 45 overly substrate 5 and a metal contact 52 is disposed on the back side of substrate 5.

At least one of the subcells can comprise a dilute nitride subcell. Examples of dilute nitride subcells include GaInNAsSb, GaInNAsBi, GaInNAsSbBi, GaInNAs, GaNAsSb, GaNAsBi, and GaNAsSbBi.

The process flow described herein is merely an example. Other process flows with different steps can be used to achieve TWVs on semiconductor material such as multijunction photovoltaic cells.

Figure 5:
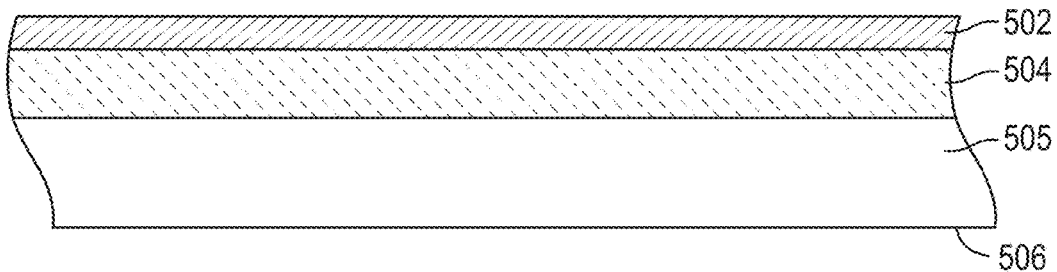
FIGS. 5-14 illustrate a process flow for fabricating a multijunction photovoltaic cell having TWVs according to certain embodiments provided by the present disclosure.
Figure 6:
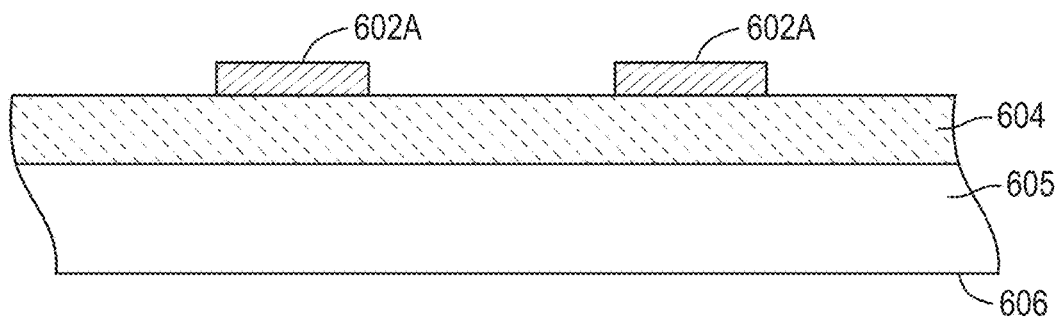
Figure 7:
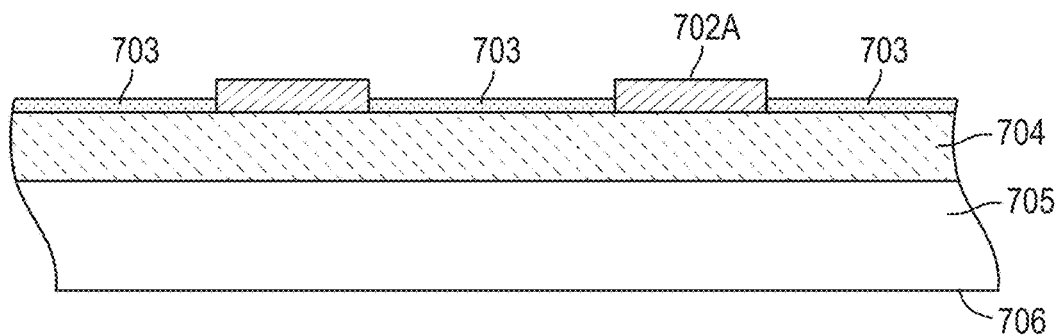
Figure 8:
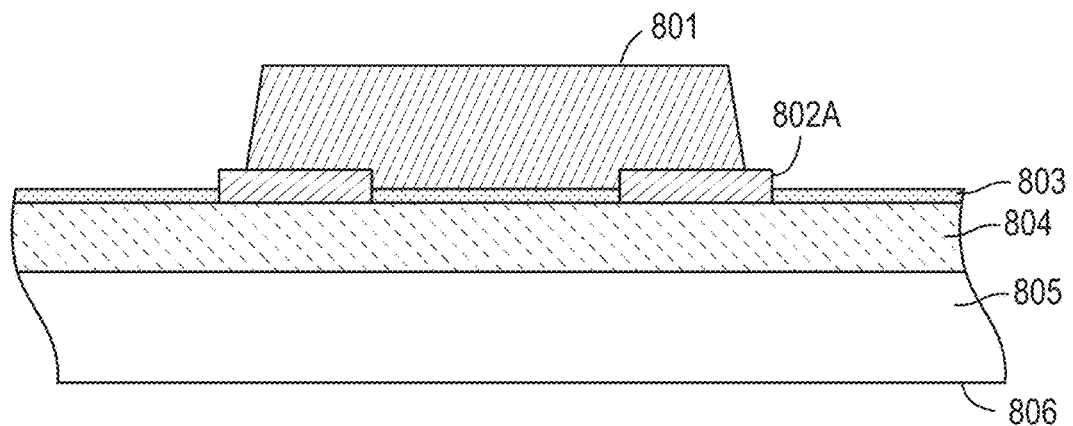
Figure 9:
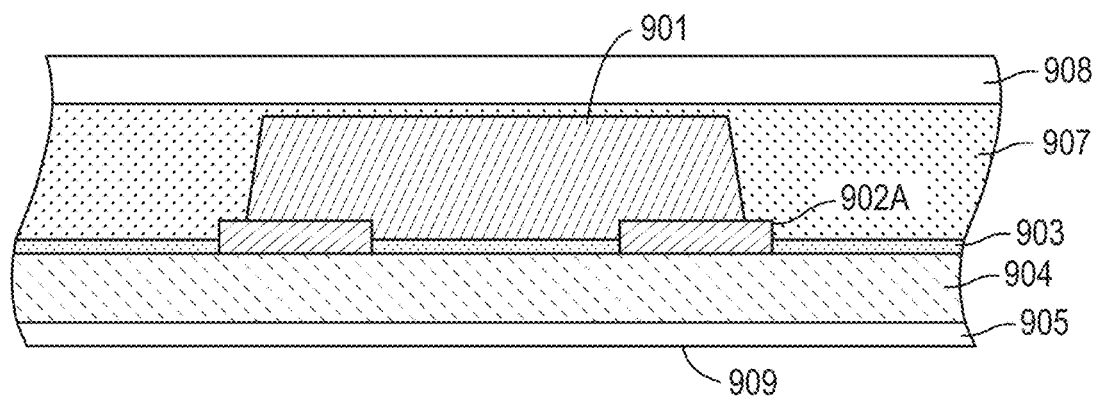
Figure 10:
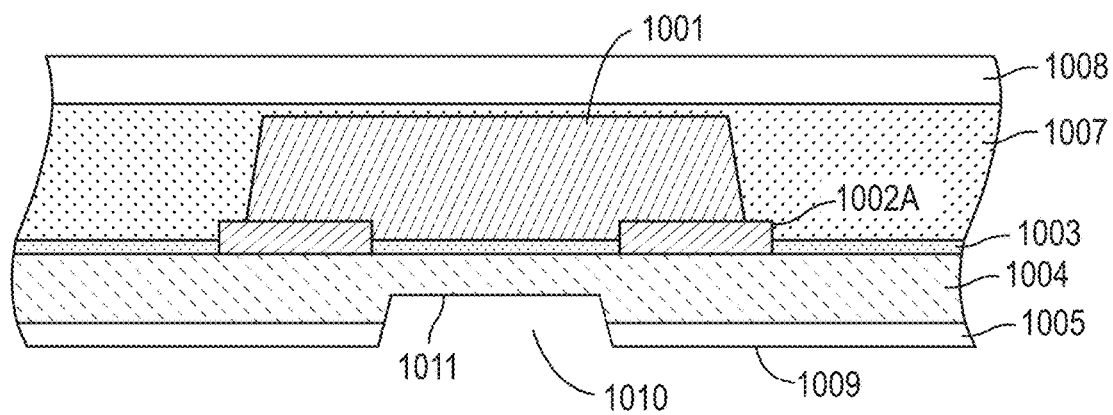
Figure 11:
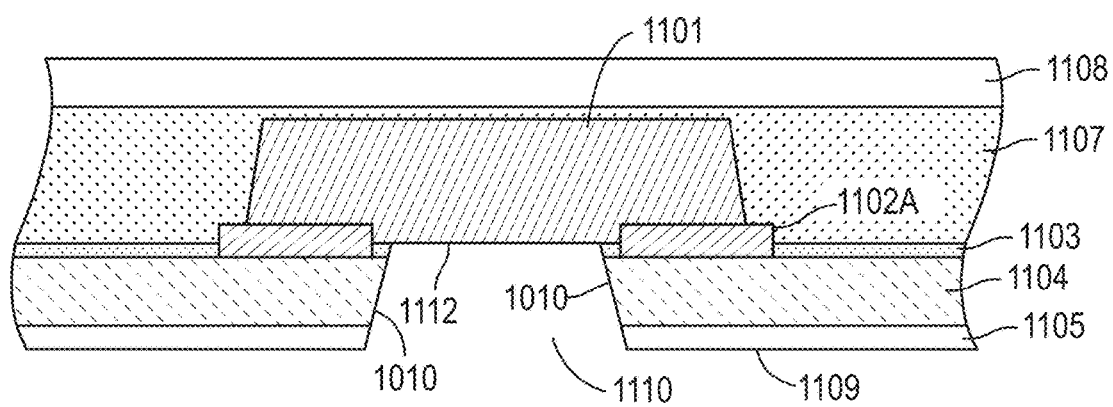
Figure 12:
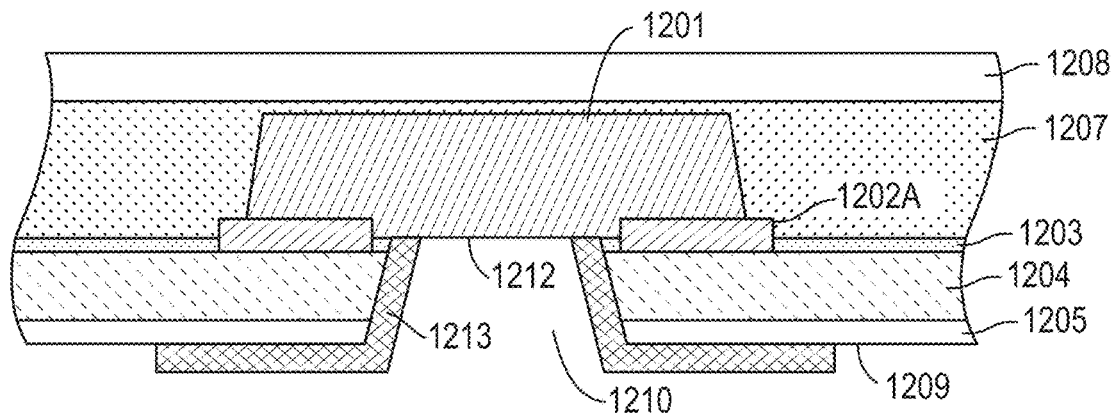
Figure 13:
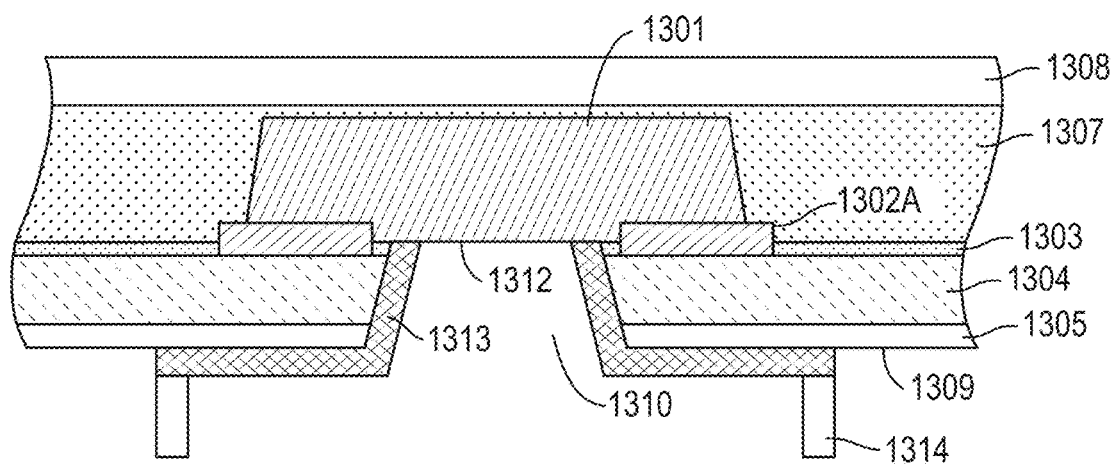
Figure 14:
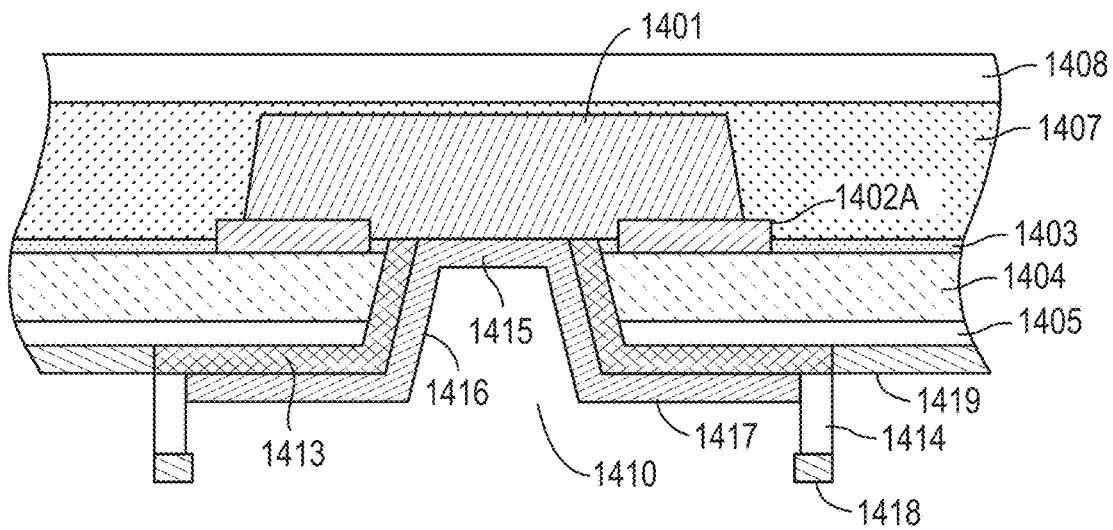
Figure 15:
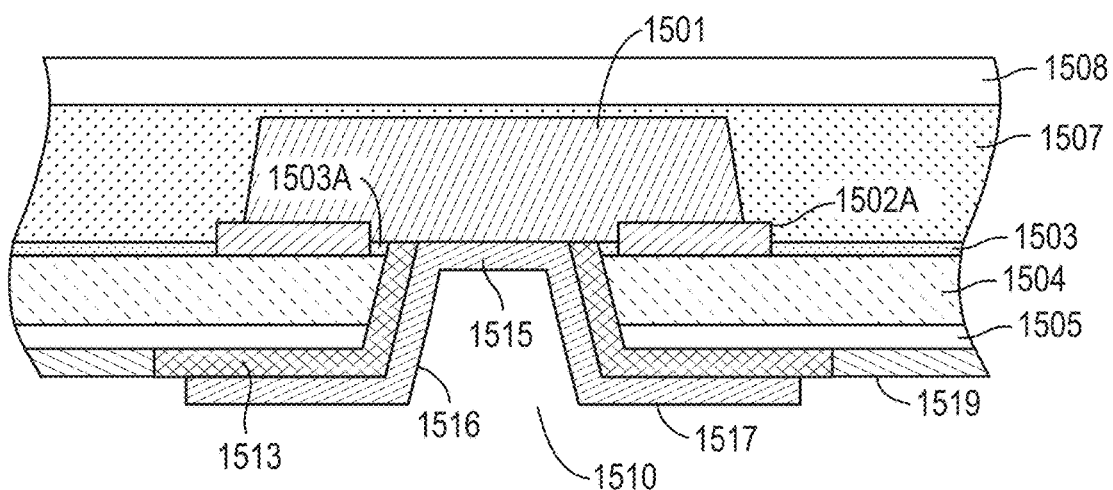
FIG. 15 shows a cross-section of a multijunction photovoltaic cell with a TWV fabricated using the method illustrated in FIGS. 5-14.

FIGS. 5-15 illustrate an aspect of the invention associated with etching TWVs from the front side of a semiconductor wafer in the fabrication of a back-contact solar cell. FIGS. 5-8 show steps involved in front side processing. FIGS. 8-15 show steps associated with back side processing including the wet etch steps provided by the present disclosure. The process steps and final product described can be modified by one skilled in the art to accommodate a wide variety of semiconductor devices; the steps and final product are not limited to solar cells and are applicable to other semiconductor devices and in particular to minority carrier devices. The semiconductor wafer cross-sections shown in FIGS. 5-15 can be summarized as follows: FIG. 5 shows a heteroepitaxial layer on an unmodified substrate; FIG. 6 shows a wafer after contact cap layer patterning; FIG. 7 shows a wafer following application of an ARC; FIG. 8 shows a wafer following application of a front side metal pad; FIG. 9 shows a wafer after wafer bonding, back-grinding and wet etch back-thinning; FIG. 10 shows a wafer after via hole lithography and wet etch; FIG. 11 shows a wafer after via etch stop (ARC/dielectric) removal; FIG. 12 shows a wafer after passivation layer patterning and hard bake; FIG. 13 shows a wafer after back side and via-metal isolation lithography; FIG. 14 shows a wafer after back side and TWV-metal deposition; and FIG. 15 shows a completed device after metal lift off (TWV metal and back side metal separation).

A semiconductor wafer can first undergo front side processing (FIGS. 5-8). As shown in FIG. 5, a semiconductor wafer can comprise a substrate layer 505 and the back side 506 of the wafer, and a heteroepitaxial layer 504 overlying the substrate layer 505. Materials used to form the substrate include, for example, germanium, gallium arsenide, alloys of germanium, and alloys of gallium arsenide. The substrate can be, for example, from 100 μm to 1000 μm thick, or from 100 μm to 700 μm thick. For example, a GaAs substrate can be from 100 μm to 700 μm thick, and a Ge substrate can be from 100 μm to 200 μm thick. Materials used to form the heteroepitaxial layer include, for example, alloys of one or more elements from group III and group V on the periodic table, such as indium gallium phosphide, indium phosphide, gallium arsenide, aluminum gallium arsenide, indium gallium arsenide, and dilute nitride compounds. FIGS. 5-6 show cap region 502 and patterned cap regions 602A, which are formed on the front side of the semiconductor wafer, adjacent to the heteroepitaxial layer (504 and 604). The patterned cap regions 602A may be patterned in a disk shape, but can also be patterned in a variety of geometric configurations, as well as shaped to function as gridlines, busbars, pads or any type of conductive component of an electrical device. FIG. 6 shows substrate 605, back side 606 of substrate 605, heteroepitaxial layer 604, and patterned cap regions 602A following post-cap etch.

In some embodiments, an ARC (703 in FIG. 7) may be applied over the heteroepitaxial layer 704. FIG. 7 shows substrate 705, back side 706 of substrate 705, heteroepitaxial layer 704, ARC 703, and patterned cap regions 702A following post-cap etch. Some embodiments may also employ the application of front side metal pads (801 in FIG. 8) and narrow metal gridlines (not shown). At the end of front side processing, a semiconductor wafer with an unmodified back side 806 of substrate 805 can be obtained, as shown in FIG. 8. FIG. 8 shows substrate 805, back side 806 of substrate 805, heteroepitaxial layer 804 overlying substrate 805, ARC 803 disposed between patterned cap regions 802A, and front side metal pad 801 electrically connected to patterned cap regions 802A.

In FIG. 9, the semiconductor wafer shown in FIG. 8 can be permanently bonded to a coverglass 908 with an optically clear adhesive 907. In some embodiments, the coverglass 908 may be space grade coverglass such as radiation resistant coverglass, which may be made of borosilicate glass. The back side of the substrate (806 in FIG. 8) can be thinned (909 in FIG. 9) by wet etching, back-grinding, or other methods. In some embodiments, the thinned substrate 905 can be between 20 μm and 200 μm thick post-thinning, such as from 20 μm to 100 μm, from 20 μm to 80 μm, or from 20 μm to 50 μm. Thinned devices are desirable in some applications, for example, in space solar cells to reduce the weight of the photovoltaic cell. It is also possible that a substrate can be bonded to a carrier using, for example, a sacrificial or lift-off layer. The carrier is then removed before forming TWVs. A thinned substrate also facilitates the formation of high quality TWVs. FIG. 9 shows thinned substrate 905, back side 909 of thinned substrate 905, heteroepitaxial layer 904, ARC 903, patterned cap regions (post-cap etch) 902A, front side metal pad 901, optically clear adhesive 907, and coverglass 908.

In FIG. 10, the back side of the substrate 1009 is patterned with a photosensitive polymer or any suitable type of suitable masking material in a desired TWV pattern (not shown), aligning TWV holes with front side metal pads 1001 and patterned cap regions 1002A that end up forming a perimeter around the ARC-adjacent region of the TWV holes 1010. Etching TWV holes 1010 starts from the back side 1009 of the substrate 1005 and stops at the ARC 1003. In some embodiments, the etchant mixture used can comprise a volumetric ratio of 10% to 50% hydrochloric acid with a volumetric ratio of 10% to 50% iodic acid in deionized water. The etchant mixture can have a temperature that ranges from 10° C. to 140° C. As shown in FIG. 10, etching proceeds from the back side 1009 through thinned substrate 1005 and through heteroepitaxial layer 1004. Etching stops at the ARC 1003, which serves as a selective dielectric etch stop layer 1011. Then, the patterned photosensitive polymer/masking material (not shown) and the ARC 1003 that is exposed in the TWV hole 1010 are removed. FIG. 10 also shows heteroepitaxial layer 1004, optically clear adhesive 1007, and coverglass 1008.

Suitable wet etchant mixtures comprising hydrochloric acid and iodic acid are disclosed, for example, in U.S. Application Publication No. 2013/0312817, which is incorporated by reference in its entirety. Smooth sidewalls etched with the etchant mixture can comprise traces of iodine. The heteroepitaxial sidewalls can be characterized by a macroscopically smooth surface without significant undercutting and that continuously widens from the substrate to the ARC. In some embodiments, the etchant mixture used can comprise a volumetric ratio of 30% to 35% hydrochloric acid with a volumetric ratio of 14% to 19% iodic acid in deionized water. The etchant mixture can have a temperature within the range from 30° C. to 45° C.

Figure 4B:
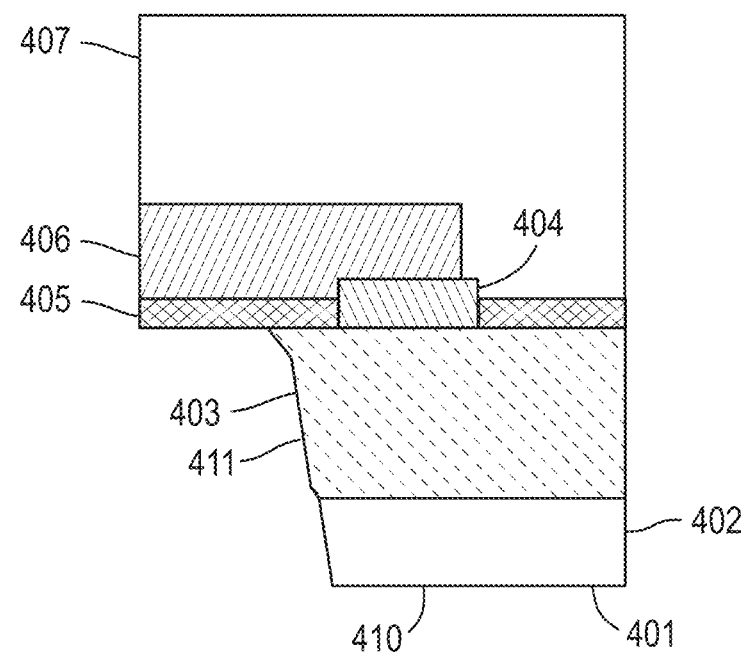
FIG. 4B shows a schematic cross-section of a semiconductor wafer representative of a scanning electron microscopy image fabricated using methods provided by the present disclosure.

FIG. 11 shows the result of the steps described with reference to FIG. 10. FIG. 11 shows the exposed bottom 1112 of the front side metal pad 1101 after the ARC is removed from TWV hole 1110. The sidewalls 1010 of the TWV holes (1010 and 1110) are smooth, as shown in FIG. 4B; there is an absence of pitting (411) and rough sidewall surfaces that results using prior art methods (FIG. 4A). There is also an absence of pitting on the back side (410) of the wet etched back-thinned substrate (1009 and 1109) as shown in FIG. 4B. The semiconductor wafer is sufficiently protected by a photosensitive polymer/masking material (not shown) from etching that deviates from a desired etching pattern. The device shown in FIG. 4B includes coverglass 407, front side metal pad 406, patterned cap regions 404, ARC 405, heteroepitaxial layer 403, substrate 402, and back side surface 401 of substrate 402. The TWV sidewalls of heteroepitaxial layer 411 are smooth, without pitting and with reduced undercutting. Also, no pitting 410 is present on the back side surface 401 of substrate 402. FIG. 11 shows front side metal pad 1101, patterned cap region (post-cap etch) 1102A, ARC (dielectric) 1103, heteroepitaxial layer 1104, substrate 1105, optically clear adhesive 1107, coverglass 1108, backside of the wet etched back-thinned substrate 1109, TWV hole 1110, and exposed bottom of the front side metal pad 1112 after TWV etch stop removal.

The ARC at the top of the TWV 1110 serves as an etch stop for the wet etch. After the wet etch and via formation the ARC at the top of the TWV can subsequently be removed, for example by dry etching or by wet etching using, for example, hydrofluoric acid, to expose front side metal pad 1112. Residual ARC 1109 can remain between the patterned cap region 1102A and the TWV 1110. In certain embodiments, cap regions may not be present and the metal pad may overly only the ARC layer. After wet etch and TWV formation, a portion or the entire ARC layer previously underlying the metal pad may be removed to expose the lower surface for the metal pad. If a portion of the ARC layer is removed there will be an ARC layer between a portion of the metal pad and the heteroepitaxial layer.

The profiles shown FIG. 4A and FIG. 4B are for illustration purposes and other etch profiles may be characterized by other roughened and/or pitted surfaces. It is to be understood that the examples of semiconductor morphology illustrated in the present disclosure are not limited to the substrate, heteroepitaxial and processing layers. It is known to one skilled in the art that other embodiments may be present in semiconductor structures and devices.

In FIG. 12, a passivation layer 1213 is applied over the back side 1209 of the wet etched back-thinned substrate 1205 according to a desired pattern to passivate the substrate 1205 from metal contact. The passivation layer 1213 also lines the walls of the TWV holes 1210. The passivation layer 1213 can be applied using standard deposition techniques, including for example, photosensitive polymer application, plasma-enhanced chemical vapor deposition, atomic layer deposition, and electrografting. In some embodiments, hard baking can be used in this step. The bottom 1212 of the front side metal pad 1201 remains exposed after TWV etch stop removal and deposition of the passivation layer 1213. FIG. 12 shows front side metal pad 1201, patterned cap regions (post-cap etch) 1202A, ARC 1203, heteroepitaxial layer 1204, thinned substrate 1205, optically clear adhesive 1207, coverglass 1208, back side 1209 of the wet etched back-thinned substrate 1205, TWV hole 1210, exposed bottom 1212 of the front side metal pad 1201 after TWV etch stop removal, and passivation layer 1213.

In FIG. 13, TWV metal isolation resist pattern 1314 can be formed with a photosensitive polymer. This patterning is carried out, for example, by photolithography techniques which may or may not require hard baking, depending on the specific embodiment. The bottom 1312 of the front side metal pad 1301 remains exposed 1312. FIG. 13 shows front side metal pad 1301, patterned cap regions (post-cap etch) 1302A, ARC 1303, heteroepitaxial layer 1304, thinned substrate 1305, optically clear adhesive 1307, coverglass 1308, back side of the wet etched back-thinned substrate 11309, TWV hole 1310, exposed bottom 1312 of the front side metal pad 1301 after TWV etch stop removal, passivation layer 1313, and back side and TWV metal isolation resist pattern 1314.

In FIG. 14, TWV metal 1415 is applied such that the TWV metal 1415 lines the previously exposed bottom of the front side metal pad 1401 and lines the sidewalls 1416 of TWV holes 1410, forming an electrical interconnection to the TWV front side metal pad 1407. The TWV metal 1415 also lines a portion of the back side of the substrate (1417 and 1419), bounded by the resist 1414 from the previous step (FIG. 13). In some embodiments, these TWV and back side substrate metals (1415, 1416, 1417 and 1419) can be applied in a single deposition step. Sacrificial metal 1418 and metal isolation resist pattern 1414 are then lifted off to isolate positive and negative electrical contacts (front side and back side electrical contacts), leading to the product shown in FIG. 15. FIG. 14 shows front side metal pad 1401, patterned cap regions (post-cap etch) 1402A, ARC 1403, heteroepitaxial layer 1404, substrate 1405, optically clear adhesive 1407, and coverglass 1408, on the top side of the wet etched back-thinned substrate 1405, TWV hole 1410, passivation layer 1413, back side TWV metal isolation resist pattern 1414, TWV metal 1415 deposited on the bottom of the TWV interconnecting directly to the top side metal pad 1401, TWV metal 1416 deposited along the sidewalls of the TWV isolated from the heteroepitaxial stack and from the substrate by the passivation layer 1413, TWV metal 1417 deposited over a portion of passivation layer 1413, back side metal 1419 deposited on the back side of substrate 1405, and sacrificial metal 1418 on top of the isolation resist 1414.

The example of a completed TWV structure shown in FIG. 15 includes front side metal pad 1501, patterned cap regions (post-cap etch) 1502A, ARC 1503, residual ARC 1503A, heteroepitaxial layer 1504, substrate 1505, optically clear adhesive 1507, coverglass 1508, TWV hole 1510, ARC layer 1503, TWV metal 1515 deposited on the bottom of the TWV (electrically connecting directly to the top side metal pad 1501), TWV metal 1516 deposited along the sidewalls of the TWV and electrically isolated from the heteroepitaxial stack and from the substrate by the passivation layer 1513, TWV metal 1517 deposited on the back side of the device, and back side metal 1519 electrically connected to substrate 1505.

A TWV can be, for example, from 20 µm to 50 µm deep, or from 10 µm to 200 µm deep. A TWV can have a width, for example, from about 10 µm to 500 µm, from 10 µm to 400 µm, from 100 µm to 400 µm, or from 100 µm to 250 µm. A TWV can be characterized, for example, by an aspect ratio from 0.5 to 1.5 from 0.8 to 1.2, or from 0.9 to 1.1.

Referring to FIG. 15, depending on the width of the top of the TWV structure, there can be a residual ARC layer 1503A or section between a portion of the front side metal 1501 and the heteroepitaxial layer 1504. The residual ARC layer can be between the patterned cap region 1502A and the passivation layer 1513 on the sidewalls of the TWV. If the width of the top of the TWV structure is large, then there may not be a residual ARC layer in the top of the TWV within the patterned cap region.

Figure 16A:
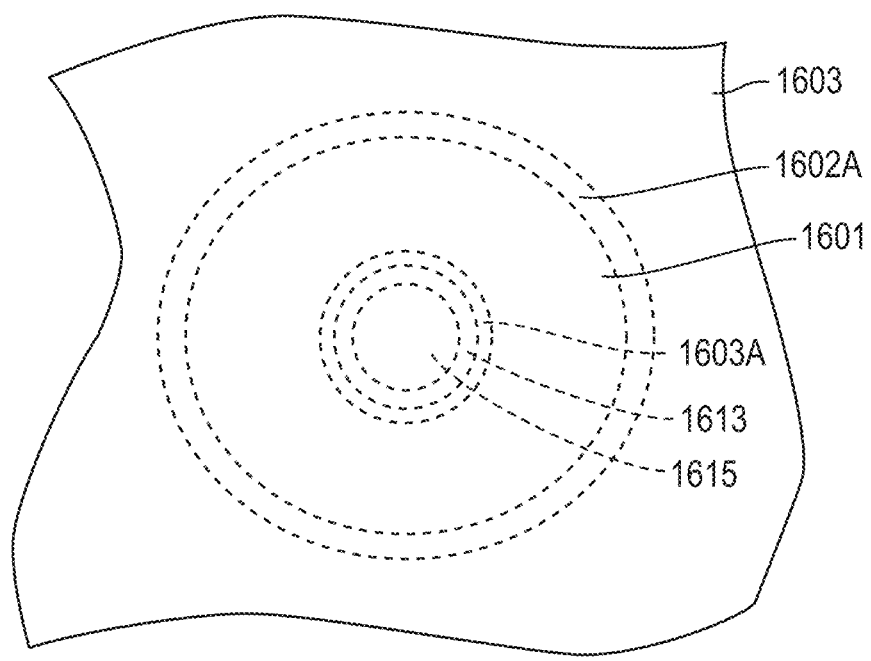
FIG. 16A shows a top view of the multijunction photovoltaic cell shown in FIG. 15.
Figure 16B:
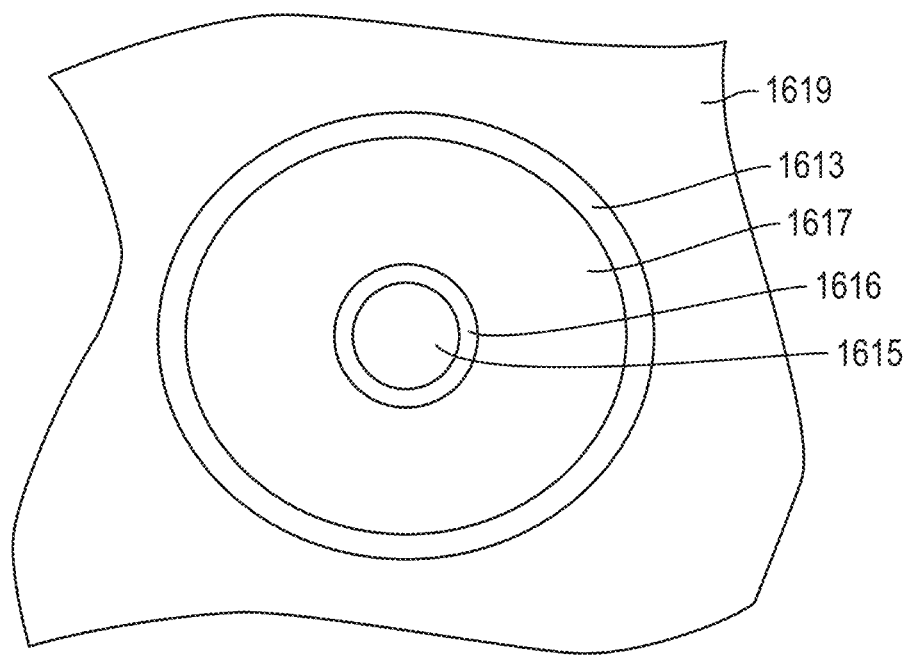
FIG. 16B shows a bottom view of the multijunction photovoltaic cell shown in FIG. 15.

FIG. 16A and FIG. 16B each show a cross-section of a completed device viewed from the top of the semiconductor wafer and from the bottom of the semiconductor wafer, respectively. This device was manufactured using the processes illustrated in FIGS. 5-15. FIG. 16A and FIG. 16B represent an example of a particular embodiment and do not limit the present disclosure. Modifications in the processes and the resulting devices by one skilled in the art may result in final products with variations. Possible variations include device structure, shape, materials and dimensions. For example, although the patterned cap regions 1602A and front side metal pad 1601 are shown to be annular, they are not limited to this shape and represent only an embodiment of the present disclosure. Other shapes that may be used include, for example, squares and rectangles. In the example of a device that is manufactured by processes shown in FIGS. 5-15, a front side metal pad lies directly over the TWV hole. In another example, where the processes are as described in FIGS. 17-27, a gold plug can be present in a device that is manufactured by processes shown in FIGS. 5 and 17-27, while a front side metal pad is absent (not shown). From the top side (FIG. 16A), the following components of the device are visible: front side metal pad 1601, patterned cap regions 1602, and ARC 1603. The TWV is directly beneath front side metal pad 1601, and includes ARC 1603, passivation layer 1613, and TWV metal 1615 that connects directly to the back side of top side metal pad 1601. From the bottom side (FIG. 16B), the following components of the device are visible: back side metal 1619, passivation layer 1613, TWV metal 1615 on back side of and electrically connected to the top side metal pad 1501, TWV metal 1616 along the sidewalls of the TWV isolated from the heteroepitaxial layer and from the substrate by the passivation layer, and TWV metal 1617 deposited on the back side of the device. These are examples of a particular embodiment and do not limit the scope of the disclosure. Modifications in the method and the device disclosed may result in final products with variations. The final product fabricated by methods in the disclosure will have smooth sidewalls 411 instead of lateral undercutting and pitting of the semiconductor wafer as shown, for example, in (FIGS. 4A and 4B). This is an advantageous improvement over prior art, resulting in improved fabrication reliability and yield of devices that comprise a heteroepitaxial layer. Bonding the coverglass to the front surface of the device before fabrication of the TWV provides a carrier for subsequent processing. Most importantly the thick substrate used during epitaxial growth can be thinned using one or more methods to provide a thin substrate. The thinned substrate facilitates the formation of high quality TWVs using wet etching, and can significantly reduce the overall weight of the multijunction photovoltaic cell.

Figure 17:
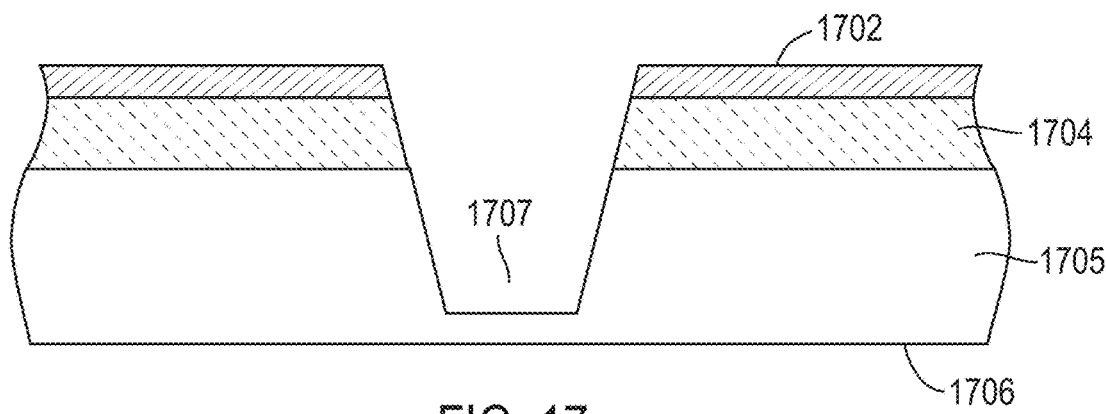
Figure 18:
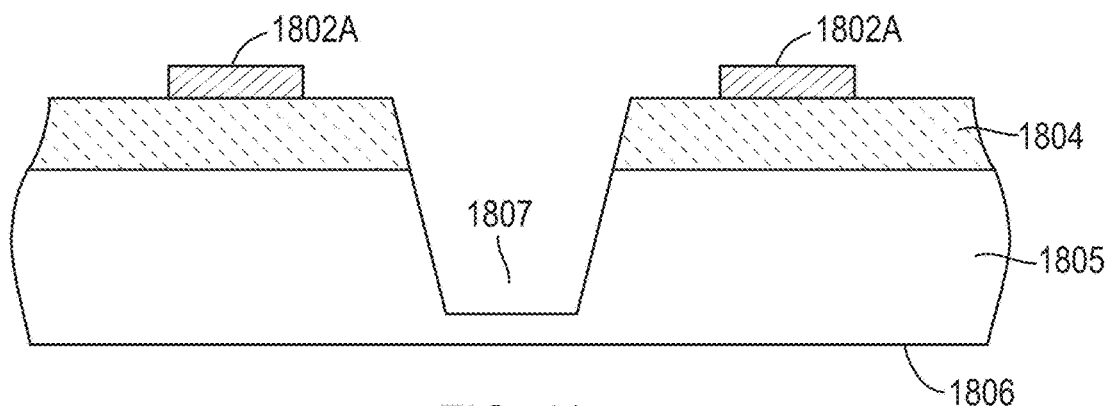
Figure 19:
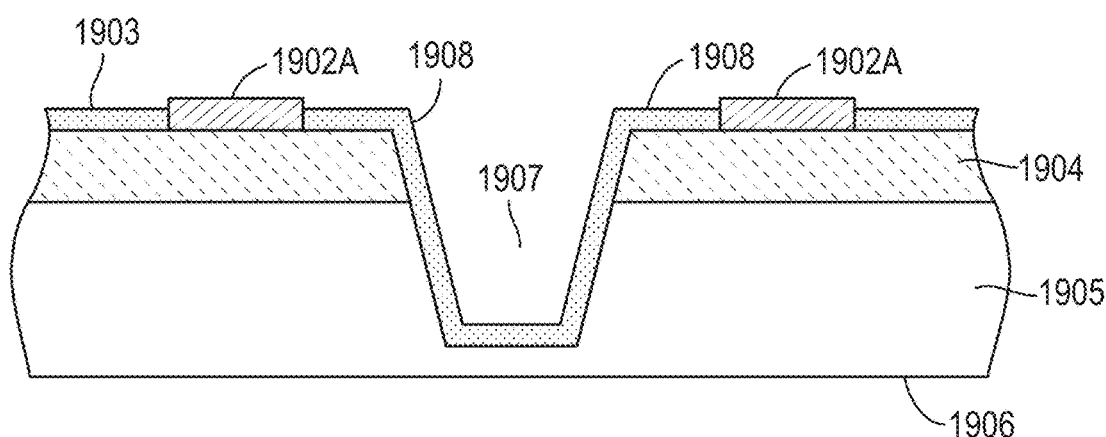
Figure 20:
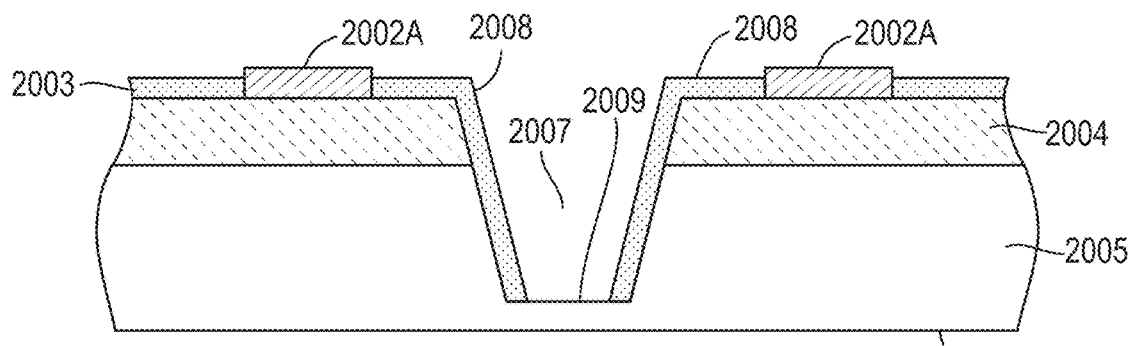
Figure 21:
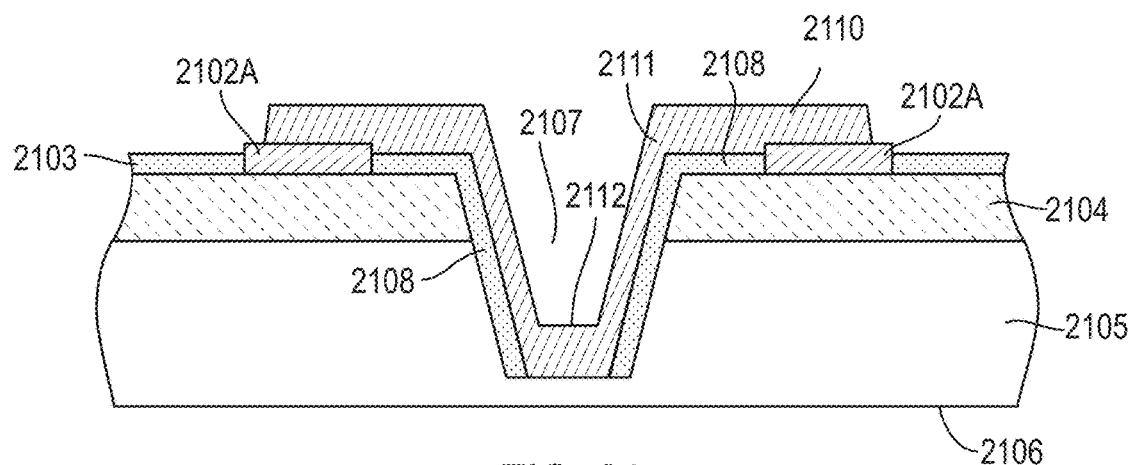
Figure 22:
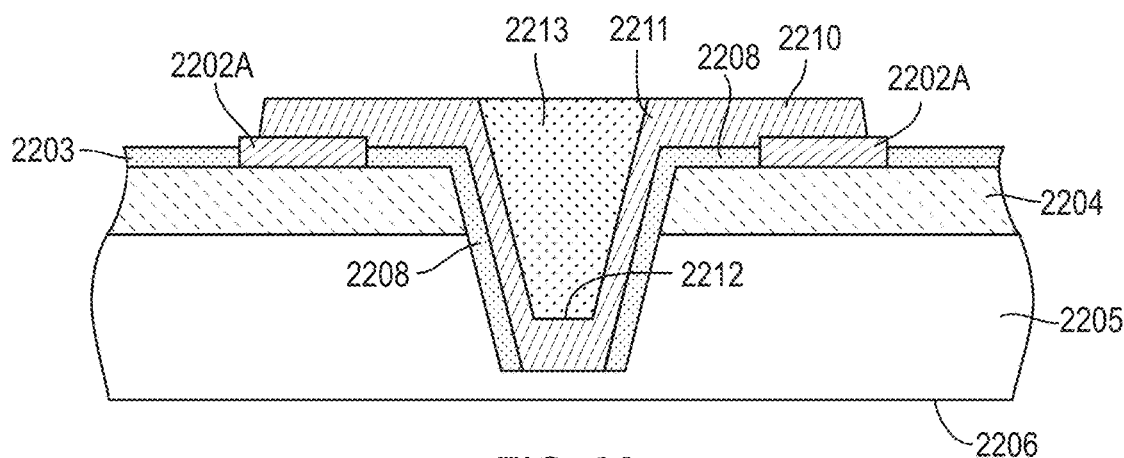
Figure 23:
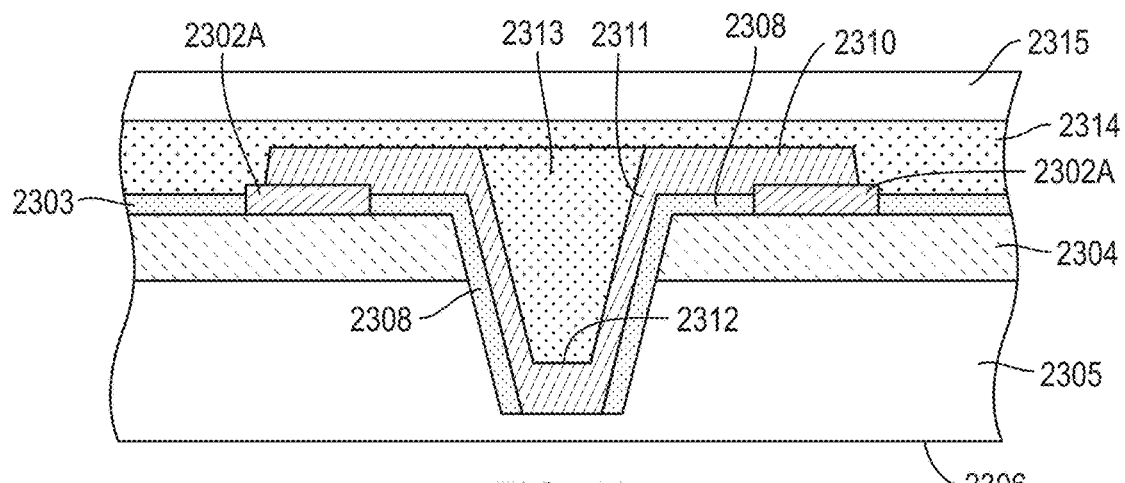
Figure 24:
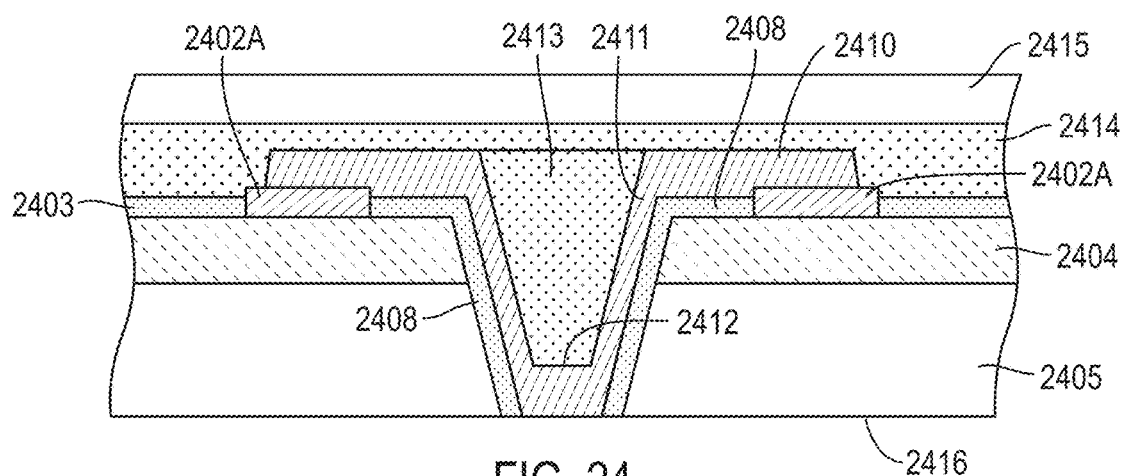
Figure 25:
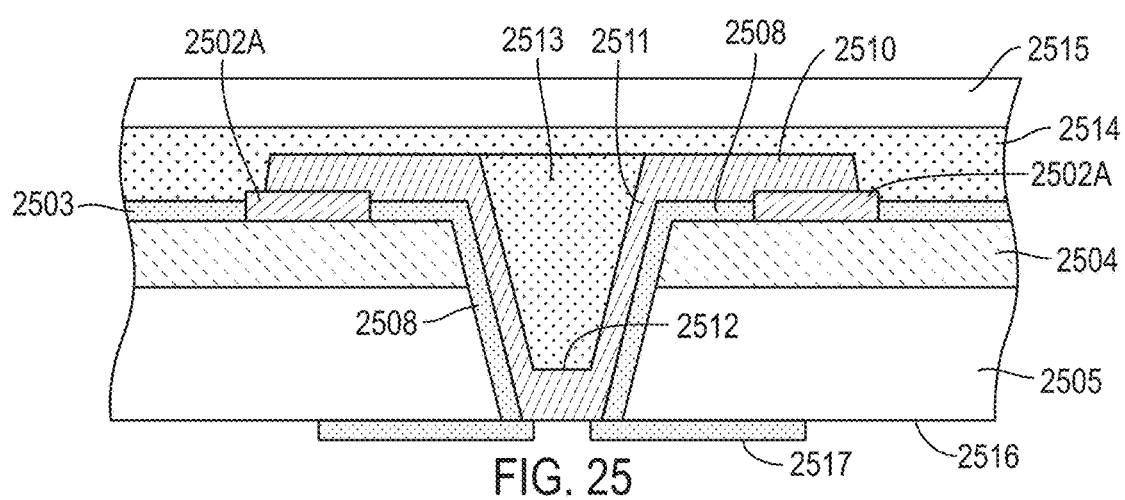
Figure 26:
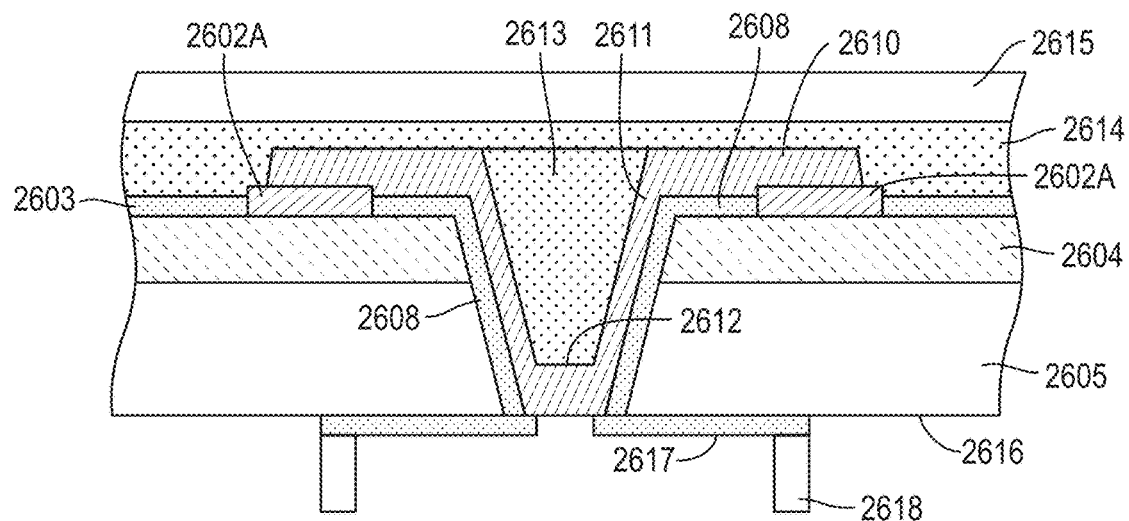
Figure 27:
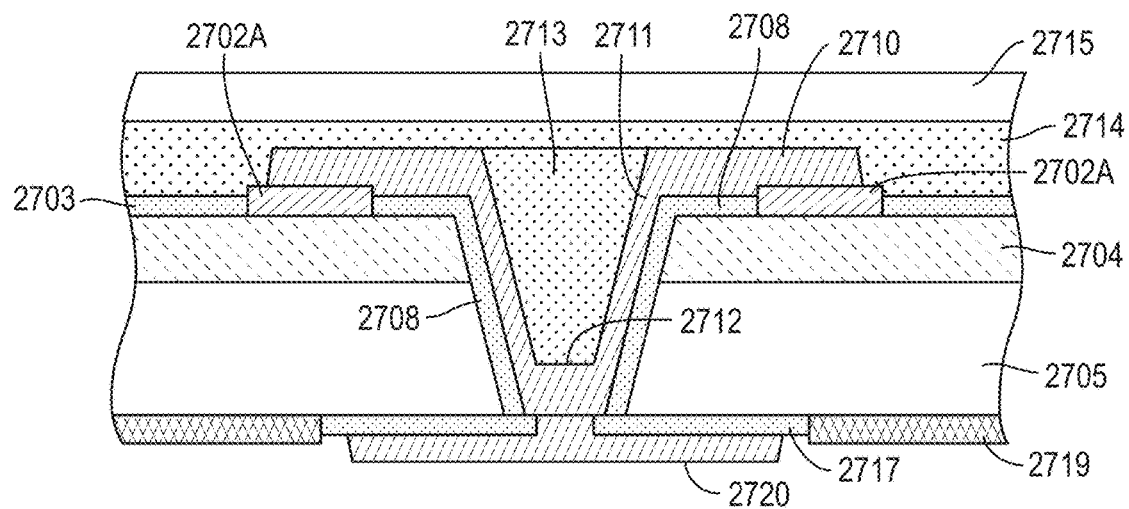
FIG. 27 shows a cross-section of a multijunction photovoltaic cell with a TWV fabricated using the method illustrated in FIGS. 5 and 17-26.

FIGS. 5 and 17-27 show an aspect of the invention that comprises etching TWVs from the front side of a semiconductor wafer in the fabrication of a back-contact surface-mountable photovoltaic cell. FIGS. 5 and 17-23 show steps associated with front side processing, including the wet etch steps highlighted in the disclosure. FIGS. 24-27 show steps involved in back side processing. The process steps and final product described can be modified by one skilled in the art to accommodate a wide variety of semiconductor devices; the steps and final product are not limited to solar cells. The process steps illustrated in FIGS. 5 and 17-27 can be summarized as follows: FIG. 5 shows a heteroepitaxial layer on an unmodified substrate; FIG. 17 shows a wafer after via hole lithography and wet etch; FIG. 18 shows a wafer after contact cap layer patterning; FIG. 19 shows a wafer after ARC and passivation layer application, FIG. 20 shows a wafer after passivation layer removal from the bottom of TWV holes; FIG. 21 shows a wafer after front side metal seed layer lithography and evaporation; FIG. 22 shows a wafer after gold plug lithography and electroplating; FIG. 23 shows a wafer after mounting on coverglass; FIG. 24 shows a wafer after back-grinding and wet etch back-thinning; FIG. 25 shows a wafer after back side passivation layer patterning and hard bake; and FIG. 26 shows a wafer after back side and via-metal isolation lithography; and FIG. 27 shows a completed device after metal lift off (TWV metal and back side metal separation).

A semiconductor wafer (FIG. 5) can be provided comprising a heteroepitaxial layer 504 overlying the front side of the substrate 505, and a cap layer 502 overlying the front side of the heteroepitaxial layer 504. Cap layer 502 is electrically connected to the topmost subcell. The substrate includes back side 506. Materials used to form the substrate include for example, germanium, gallium arsenide, germanium alloys, and gallium arsenide alloys. Materials used to form the heteroepitaxial layer include, for example, alloys of one or more elements from group III and group V on the periodic table, such as indium gallium phosphide, indium phosphide, gallium arsenide, aluminum gallium arsenide, indium gallium arsenide, and dilute nitride compounds. The semiconductor wafer can undergo front side processing (FIGS. 5 and 17-22). TWV holes (1707 in FIG. 17) can be formed by wet etching as determined by a photosensitive polymer pattern or any type of suitable masking pattern (not shown). Etching of TWV holes 1707 starts from the front side of the cap layer 1702 extends through heteroepitaxial layer 1704, and stops in the substrate 1705 at any desired wafer depth before the wafer is etched completely through to the back side 1706. In some embodiments, the etchant mixture used is a volumetric ratio of 10% to 50% hydrochloric acid with a volumetric ratio of 10% to 50% iodic acid and deionized water. The mixture can have a temperature that ranges from 10° C. to 140° C. The patterned photosensitive polymer/masking material (not shown) can be removed.

After wet etching TWV holes (1807 in FIG. 18), patterned cap regions 1802A are formed, determined by a photosensitive polymer pattern or any type of suitable masking pattern (not shown). The patterned cap regions 1802A may be patterned in a disk shape, but can also be patterned in a variety of geometric configurations, as well as shaped to function as gridlines, busbars, pads and any type of conductive component of an electrical device. FIG. 18 shows patterned cap regions (post-cap etch) 1802A, heteroepitaxial layer 1804, substrate 1805, back side 1806 of the substrate, and TWV hole 1807.

In FIG. 19, ARC (1903, 1908) functions as a passivation layer after it is applied over the heteroepitaxial layer 1904, surrounding patterned cap regions 1902A and over the TWV sidewalls and bottom of TWV hole 1907. Photosensitive polymers can also be used as a passivation layer instead of an ARC. The passivation layer can be applied using standard deposition techniques, including, for example, photosensitive polymer application, plasma-enhanced chemical vapor deposition, atomic layer deposition, and electrografting. In some embodiments, hard baking is used in this step. FIG. 19 also shows substrate 1905 and back side 1906 of substrate 1905.

In FIG. 20, the ARC or passivation layer is removed from the front side of the bottom of the TWV hole 2007 to expose the front side 2009 of the wafer substrate that lies at the bottom of the TWV hole 2007. FIG. 20 shows patterned cap regions (post-cap etch) 2002A, ARC 2003, heteroepitaxial layer 2004, substrate 2005, back side 2006 of the substrate, TWV hole 2007, ARC 2008, and exposed bottom 2009 of the TWV after removal of the passivation layer.

In FIG. 21, metal is deposited from the front side of the semiconductor wafer, such that a metal seed layer lines the TWV holes 2107 and overlies the TWV sidewalls 2111, the bottom of the TWV 2112 and the front side of the patterned cap regions 2102A and certain desired areas of the ARC 2103. Metal deposition/metallization is determined by metal isolation resist pattern (not shown) that can be formed with a photosensitive polymer. This patterning can be carried out, for example, using standard photolithography techniques which may or may not require hard baking, depending on the specific embodiment. In some embodiments, this metallization step uses an evaporation method. The deposited metal can function as a front side metal pad as well as a conducting metal seed layer for electroplating the TWV sidewalls and the TWV bottom. FIG. 21 shows patterned cap regions (post-cap etch) 2102A, ARC 2103, heteroepitaxial layer 2104, substrate 2105, back side 2106 of the substrate 2105, TWV hole 2107, ARC 2108 within the via, front side metal 2110, metal layer 2109 deposited along the sidewalls 2111 of the TWV isolated from the heteroepitaxial stack and the substrate by the passivation layer (ARC 2108), and metal layer 2112 deposited on the bottom of the TWV 2107.

In FIG. 22, gold or other electrically conductive metal or alloy can be applied within the TWV by lithography and electroplating to form a gold plug 2213 in the TWV, directly contacting the metal layer deposited on the TWV bottom and sidewalls (2211, 2212). The gold plug mechanically reinforces the TWV structure, allowing conduction of higher current density with low resistive losses. FIG. 22 includes patterned cap regions (post-cap etch) 2202A, ARC 2203, heteroepitaxial layer 2204, substrate 2205, backside 2206 of the substrate, ARC 2208 within and around the TWV, front side metal 2210, metal layer 2211 deposited along the sidewalls of the TWV isolated from the heteroepitaxial stack and the substrate by the passivation layer (ARC 2208), metal layer 2212 deposited on the bottom of the TWV, and electroplated gold plug 2213.

In FIG. 23, the front side of the semiconductor wafer can be permanently bonded to coverglass 2315 with an optically clear adhesive 2314. In some embodiments, the coverglass may be space grade coverglass, which may be made of borosilicate glass. The coverglass can serve as a carrier for further processing from the back side of the semiconductor wafer. FIG. 23 includes patterned cap regions (post-cap etch) 2302A, ARC 2303, heteroepitaxial layer 2304, substrate 2305, back side 2306 of the substrate, ARC 2308 within the TWV, front side metal 2310, metal layer 2311 deposited along the sidewalls of the TWV isolated from the heteroepitaxial stack and the substrate by the passivation layer (ARC 2308), metal layer 2312 deposited on the bottom of the TWV, electroplated gold plug 2313, optically clear adhesive 2314, and coverglass 2315.

In FIG. 24, the back side of the substrate 2416 can be thinned by wet etching, back-grinding, or other methods. In some embodiments, the substrate can be, for example, between 20 μm and 200 μm thick, less than 20 μm thick, or from 40 μm to 80 μm thick, post-thinning Thinned devices are desirable in some applications, including, for example, space solar cells. FIG. 24 includes patterned cap regions (post-cap etch) 2402A, ARC 2403, heteroepitaxial layer 2404, substrate 2405, ARC 2408 within TWV, front side metal 2410, metal layer 2411 deposited along the sidewalls of the TWV isolated from the heteroepitaxial stack and the substrate by the passivation layer (ARC 2408), metal layer 2412 deposited on the bottom of the TWV, electroplated gold plug 2413, optically clear adhesive 2414, coverglass 2415, and back side of the wet etched back-thinned substrate 2416.

In FIG. 25, a passivation layer 2517 can be applied on the back side 2516 of the substrate 2505 according to a desired pattern to passivate the substrate from metal contact. The passivation layer 2508 also lines the walls of the TWV holes. The passivation layer can be applied using standard deposition techniques, including, for example, photosensitive polymer application, plasma-enhanced chemical vapor deposition, atomic layer deposition, and electrografting. In some embodiments, hard baking is used in this step. The bottom of the front side metal pad remains exposed 2512. FIG. 25 includes patterned cap regions (post-cap etch) 2502A, ARC 2503, heteroepitaxial layer 2504, substrate 2505, ARC 2508 lining the TWV, front side metal 2510, metal layer 2511 deposited along the sidewalls of the TWV isolated from the heteroepitaxial stack and the substrate by the passivation layer, metal layer 2512 deposited on the bottom of the TWV, electroplated gold plug 2513, optically clear adhesive 2514, coverglass 2515, back side of the wet etched back-thinned substrate 2516, and passivation layer 2517 on backside surface 2516.

In FIG. 26, back side and TWV metal isolation resist pattern 2618 can be applied to determine the subsequent deposition of back side metal (2719 in FIG. 27) and TWV metal (2720 in FIG. 27) deposition. In some embodiments, these back side and TWV metals can be applied in a single deposition step, or can be applied in more than one deposition steps. FIG. 26 includes patterned cap regions (post-cap etch) 2602A, ARC 2603, heteroepitaxial layer 2604, substrate 2605, ARC 2608 lining the sidewalls of the TWV, front side metal 2610, metal layer 2611 deposited along the sidewalls of the TWV isolated from the heteroepitaxial stack and the substrate by the passivation layer, metal layer 2612 deposited on the bottom of the TWV, electroplated gold plug 2613, optically clear adhesive 2614, coverglass 2615, back side of the wet etched back-thinned substrate 2616, passivation layer 2617, and back side and TWV metal isolation resist pattern 2618.

FIG. 27 shows a completed device after the back side sacrificial metal and metal isolation resist pattern are lifted off to isolate positive and negative electrical contacts. FIG. 27 shows patterned cap regions (post-cap etch) 2702A, ARC 2703, heteroepitaxial layer 2704, substrate 2705, ARC 2708 lining the sidewalls of the TWV, front side metal 2710, metal layer 2711 deposited along the sidewalls of the TWV isolated from the heteroepitaxial stack and the substrate by the passivation layer, metal layer 2712 deposited on the bottom of the TWV, electroplated gold plug 2713, optically clear adhesive 2714, coverglass 2715, passivation layer 2717, back side metal 2719 electrically connected to the back side of substrate 2705, and TWV metal 2720 deposited on the back side of the semiconductor wafer and electrically connected to the TWV, the front side metal 2710, the cap regions 2702A and the front side of heteroepitaxial layer 2704. TWV metal 2720 is electrically insulated from substrate 2705 by passivation layer 2717.

Methods of forming a semiconductor device can comprise the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and at least one additional subcell overlying the first subcell; and at least one of the first subcell or the at least one additional subcell comprises an alloy comprising one or more elements from group III of the periodic table, N, As, and an element selected from Sb, Bi and a combination thereof; a plurality of patterned cap regions overlying the heteroepitaxial layer; an anti-reflective coating overlying the heteroepitaxial layer; and a corresponding metal region overlying each of the plurality of patterned cap regions; bonding a coverglass to the front side of the semiconductor wafer with an optically clear adhesive; removing a desired amount from the semiconductor wafer by a thinning of the substrate region from the back side of the semiconductor wafer; patterning the back side of the semiconductor wafer with a back etch through-wafer via pattern; etching from the back side of the semiconductor wafer a plurality of through-wafer vias using a single wet etchant mixture, wherein each of the plurality of through-wafer vias extends from the back side of the semiconductor wafer to the anti-reflective coating overlying the heteroepitaxial layer; removing the anti-reflective coating to expose a bottom side of the corresponding metal region with a subsequent wet etching method, wherein the subsequent wet etching method is specific for the removal of the anti-reflective coating; depositing a passivation layer on the through-wafer via walls with standard deposition techniques; depositing a resist pattern on the back side of the semiconductor wafer for back side metal isolation, wherein the resist pattern underlies the passivation layer; depositing a metal on the back side of the semiconductor wafer and on the through-wafer via; and removing the resist pattern and a sacrificial metal.

In certain embodiments, methods of forming a semiconductor device comprise the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and an at least one additional subcell overlying the first subcell; at least one subcell comprises an alloy comprising one or more elements from group III of the periodic table, N, As, and an element selected from Sb, Bi and a combination thereof; and a cap layer overlying the heteroepitaxial layer; patterning the front side of the semiconductor wafer with a front etch through-wafer via pattern; etching from the front side of the semiconductor wafer a plurality of through-wafer vias using a single wet etchant mixture, wherein, each of the plurality of through-wafer vias extends from the front side surface of the semiconductor wafer into the substrate; patterning the plurality of patterned cap regions on the heteroepitaxial layer on the front side of the semiconductor wafer; depositing an anti-reflective coating overlying the heteroepitaxial layer and the through-wafer via sidewalls; removing, from the front side, the anti-reflective coating from the bottom of the through-wafer via holes; depositing a front side resist pattern from the front side of the semiconductor wafer, wherein the front side resist pattern guides metal layer lithography; and depositing a metal on the front side of the semiconductor wafer, on the through-wafer via sidewalls and on the through-wafer via bottom.

Semiconductor devices can comprise a heteroepitaxial layer, further comprising an alloy comprising one or more elements from group III of the periodic table, N, As, and an element selected from Sb, Bi and a combination thereof; and a plurality of through-wafer vias characterized by the absence of pitting on smooth sidewall surfaces formed by a method provided by the present disclosure.

Through-wafer via structures can comprise a substrate comprising a back side and a front side; a heteroepitaxial layer overlying the front side of the substrate; an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer via extending from the back side of the substrate to the front side metal pad, wherein the through-wafer via comprises sidewalls; a passivation layer overlying a portion of the back side of the substrate and the sidewalls of the through-wafer via; and a metal layer overlying the passivation layer and the bottom surface of the front side metal pad within the through-wafer via.

Through-wafer via structures can comprise a substrate comprising a back side and a front side; a heteroepitaxial layer overlying the front side of the substrate; an anti-reflection coating overlying a first portion of the heteroepitaxial layer; a patterned cap region overlying a second portion of the heteroepitaxial layer; a front side metal overlying a portion of the anti-reflection coating and the patterned cap region; a through-wafer via extending from the back side of the substrate through a portion of the anti-reflection coating; a passivation layer overlying side walls of the through-wafer via; a metal seed layer overlying the passivation layer and plugging the bottom of the through-wafer via; and a metal overlying the metal seed layer and filling the through-wafer via.

SMCCs provided by the present disclosure facilitate low-cost, low-complexity, high-speed fabrication of solar arrays with low mass and high reliability. This is accomplished by eliminating welding processes and bulky interconnects, reducing the thickness and cost of the backside metal, reducing the overall mass of the photovoltaic device by using a thin substrate, integrating the coverglass during wafer processing, increasing solar array area utilization with the interconnections and bypass diodes integrated with interconnection substrates such as PWBs/PCBs, and increasing wafer utilization with small cells.

SMCC photovoltaic cells can be used with well-known, highly automated surface mount equipment, SMCC cells can be mounted directly to a PWB, PCB, or other interconnection substrate, which includes the interconnects between subcells. By eliminating welding interconnection strings between subcells, it becomes cost-effective to use smaller photovoltaic cells. Smaller SMCC photovoltaic cells facilitate more efficient and economical use of solar array surface area. More effective utilization of solar array area results in higher power, lower weight, and lower cost per solar cell array area.

SMCC devices provided by the present disclosure can have a front surface area of 5 $cm^2$ or less, 4 $cm^2$ or less, 3 $cm^2$ or less, 2 $cm^2$ or less, or 1 $cm^2$ or less. For example, a SMCC device provided by the present disclosure can have a front surface area from 0.5 $cm^2$ to 5 $cm^2$, from 0.5 $cm^2$ to 4 $cm^2$, from 0.5 $cm^2$ to 3 $cm^2$, from 0.5 $cm^2$ to 2 $cm^2$, or from 0.5 $cm^2$ to 1 $cm^2$. SMCC photovoltaic cells can also have other dimensions.

SMCC devices provided by the present disclosure, such as three junction SMCC devices, can have a unit mass per area less than 0.10 $g/cm^2$, a unit mass per area, for example, less than 0.09 $g/cm^2$, less than 0.08 $g/cm^2$, less than 0.07 $g/cm^2$, or less than 0.06 $g/cm^2$. SMCC devices provided by the present disclosure, such as three junction SMCC devices, can have a unit mass per area, for example, from 0.05 $g/cm^2$ to 0.10 $g/cm^2$, from 0.06 $g/cm^2$ to 0.09 $g/cm^2$, or from 0.06 $g/cm^2$ to 0.08 $g/cm^2$.

For example, solder balls or solder paste can be applied to the contact pads. The SMCC devices with applied solder are then assembled onto corresponding reciprocal contact pads on a printed circuit board and the solder reflowed to interconnect the SMCC to the printed circuit board.

Figure 36A:
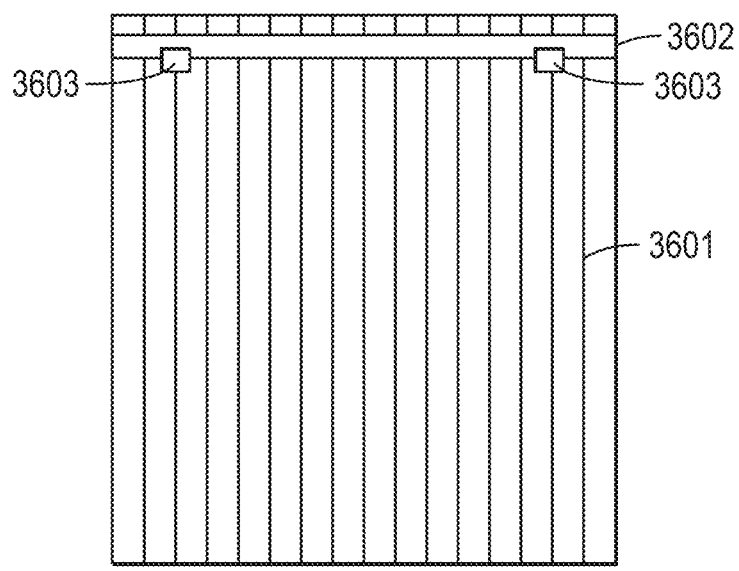
FIGS. 36A-36B show front and back views of a SMCC device according to the present disclosure with an example of a gridline, busbar, and TWV configuration.

FIG. 36A shows a top view of a front side of an example of a SMCC device including gridlines 3601 interconnected to busbar 3602, which is interconnected to back side surface mount pads (not shown) with TWVs 3603.

Figure 36B:
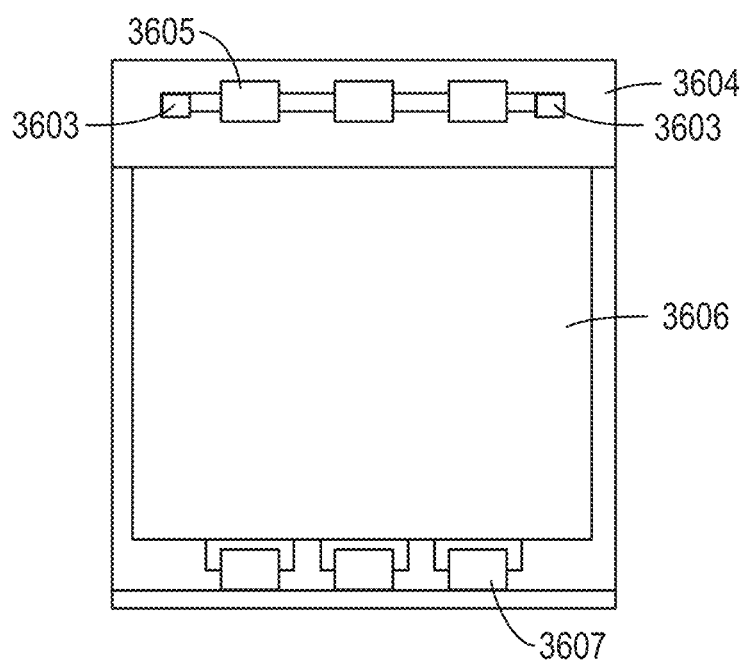

FIG. 36B shows a view of the back side of an example of a SMCC device including surface mount solder pads 3607 interconnected to back side contact 3606, surface mount solder pads 3605 interconnected to a front side contact and busbar 3602 (in FIG. 36A) by TWVs 3603. The front side surface mount pads 3605 are electrically insulated from the back surface of the SMCC device and from the back surface contact 3606 by insulator 3604.

Individual SMCC die can be assembled onto a substrate, which can be a printed circuit board or other suitable support structures such as semiconductor wafers The front surface solder pads and the back surface solder pads can have any suitable shape, dimensions, and layout suitable for surface mount assembly. An example of a surface mount configuration is shown in FIGS. 31 and 32.

The SMCC devices can be mounted to an interconnection substrate such as PWB or PCB using any suitable surface mount assembly method and using any suitable surface mount assembly materials.

The interconnection substrate such as PWB or PCB can be made of any suitable material, which can depend on the application. For example, for space applications, the printed circuit board will be qualified for space applications. A PWB or PCB can comprising solder pads for surface mounting the SMCCs and interconnects for connecting each of the SMCC devices. Bypass diodes can be mounted on the printed circuit board such as on the side of the printed circuit board opposite the side on which the SMCC devices are mounted. A bypass diode may be interconnected to one or more SMCC devices.

The front surface of the epitaxial layer can comprise front contacts in the form of thin lines forming a grid. The grid can be interconnected to a busbar. TWVs interconnect the busbar to front contact pads located on the back side of the SMCC.

After SMCC structures are fabricated at the wafer-level, each of the SMCC devices can be tested, and then singulated to provide individual SMCC devices. The individual SMCC devices can be surface mounted to a carrier such as a printed circuit board.

Another advantage of the present invention is eliminating the need to incorporate a bypass diode within each device as is required for CIC devices. Bypass diodes are used to protect a solar array from failure of individual solar cells forming the array. In prior art photovoltaic cells a silicon bypass diode is either attached to the solar cell or the bypass diode is monolithically integrated into the photovoltaic cell.

In configurations in which a bare-chip bypass diode is welded onto the photovoltaic cell as part of CIC assembly, a custom-made bare-die bypass diode chip is required. This increases the cost relative to the use of generic or off-the-shelf bypass diodes that can be used for other electronics applications. SMCC allows the use of generic, packaged bypass diodes.

To highlight the advantages of eliminating the need to attach a bypass diode as done for traditional CIC subassembly it can be useful to consider the individual steps involved with assembling bypass diodes to a CIC. Attaching a discrete bare die bypass diode to a CIC involves the delicate operation of welding one end of a metallic tab to the bare silicon bypass chip, then welding the other end of the metallic tab to a thick metallization on the semiconductor material forming the multi junction photovoltaic cell. Welding on semiconductor material, especially III-V material requires thick metallization that can include several micrometers of silver, which not only adds to the cost of the metallization, but also reduces manufacturing yield by introducing additional warp, bow, and stress on solar cell wafers. The welding operation itself is delicate, requiring stringent process control, and can be a significantly reduce manufacturing yield.

For the case of monolithically integrated bypass diodes, in traditional CICs, bypass diode integration consumes real-estate on solar cell epitaxial wafers, which is by far the most expensive component of the CIC, and also complicates epitaxial growth by adding additional process steps and conditions. With SMCC, bypass diodes do not bring those penalties.

In the SMCCs disclosed herein a low cost bare or packaged bypass diode can be assembled to a printed circuit board or printed wiring board using mature, automated, ultra-high volume pick-and-place equipment and methods used in the electronics industry. SMCC also allows for alternative bypass diode interconnection configurations. In a traditional design, a bypass diode is interconnected to or integrated within each CIC. SMCC provides the ability to interconnect the solar cell array through the PCB/PWB such that more than one SMCC device can share the same bypass diode. Fewer bypass diodes can be used and the number of bypass diodes can be optimized. With fewer protective devices, traditional bypass diodes can be replaced with more sophisticated protective devices without prohibitively increasing the overall cost.

Compared to non-surface mount photovoltaic cells, SMCC photovoltaic cells provided by the present disclosure have the following advantages:

(1) rather than dispensing adhesive and applying coverglass to each cell, the adhesive and coverglass can be applied and bonded at the wafer-level prior to backside processing;

(2) rather than using welded interconnects to the frontside and backside of the solar cells, the photovoltaic cell is interconnected to surface mount pads;

(3) rather than using discrete or monolithically integrated bypass diodes, low cost bypass diodes can be integrated into the PWB/PCB, thereby increasing the active surface area on the solar array panel and reducing the cost and complexity of the assembly process;

(4) the need to weld together strings of individual photovoltaic cells is eliminated;

(5) with welded stings of photovoltaic cells, the string is manually assembled onto a substrate using space grade adhesive; however, SMCCs can be assembled directly onto a PCB using high speed automated pick-and-place assembly methods; and (6) whereas space solar arrays typically require a manual wiring process on the backside of an array substrate to connect strings of CICs, the use of SMCCs eliminates this process by utilizing electronics industry standard production of PWBs/PCBs with integrated electrical connections.

SMCC multijunction photovoltaic cells provided by the present disclosure can be integrated to photovoltaic modules, photovoltaic sub-systems, and photovoltaic power systems for space or terrestrial applications. A photovoltaic modulate can comprise a plurality of SMCC multijunction photovoltaic cells mounted on a substrate panel.

Photovoltaic modules of the present invention can comprise a front surface area and a plurality of surface mount multijunction photovoltaic cells of the present disclosure overlying the front surface area, wherein the photovoltaic modules cover, for example, at least 70% of the front surface area, at least 80% of the front surface area, or at least 90% of the front surface area. Photovoltaic modules of the present invention can comprise a plurality of SMCC devices of the present disclosure mounted to a front surface of the module, wherein the SMCC devices cover, for example, from 60% to 90% of the front surface area of the module, from 65% to 85%, or from 70% to 80% of the front surface area of the photovoltaic module.

Surface mount multijunction photovoltaic cells of the present invention can comprise a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a back surface solder pad underlying a portion of and electrically connected to the back substrate surface; a front surface solder pad underlying and insulated from the back substrate surface; and a through-wafer-via interconnecting the front surface solder pad and the front surface contact.

Surface mount multijunction photovoltaic cells of the present invention can have a substrate that is less than 150 µm thick.

Surface mount multijunction photovoltaic cells of the present invention can have a substrate comprising Ge that is from 20 µm to 175 µm thick.

Surface mount multijunction photovoltaic cells of the present invention can have a substrate comprising GaAs that is less than 100 µm thick.

Surface mount multijunction photovoltaic cells of the present invention can be characterized by an area less than 4 cm$^2$.

Surface mount multijunction photovoltaic cells of the present invention can be characterized by a unit mass per area of less than 0.09 g/cm$^2$.

Surface mount multijunction photovoltaic cells of the present invention can have an heteroepitaxial layer comprises at least two junctions.

Surface mount multijunction photovoltaic cells of the present invention can have an heteroepitaxial layer comprising $Ga_{1-x}In_xN_yAs_{1-y-z}Sb_z$; and the content values for x, y, and z are within composition ranges as follows: $0.03 \leq x \leq 0.22$, $0.007 \leq y \leq 0.055$ and $0.001 \leq z \leq 0.05$.

$Ga_{1-x}In_xN_yAs_{1-y-z}Sb_z$ subcells can comprise a low antimony content such as, for example, $0.004 \leq z \leq 0.02$, $0.005 \leq z \leq 0.018$, $0.006 \leq z \leq 0.016$, $0.008 \leq z \leq 0.015$, $0.01 \leq z \leq 0.018$, $0.01 \leq z \leq 0.014$, $0.004 \leq z \leq 0.014$, or $0.004 \leq z \leq 0.01$.

$Ga_{1-x}In_xN_yAs_{1-y-z}Sb_z$ subcells can comprise a high nitrogen content such as, for example, $0.02 \leq y \leq 0.10$, $0.021 \leq y \leq 0.09$, $0.024 \leq y \leq 0.085$, $0.026 \leq y \leq 0.08$, $0.03 \leq y \leq 0.06$, or $0.04 \leq y \leq 0.06$.

$Ga_{1-x}In_xN_yAs_{1-y-z}Sb_z$ subcells can comprise a low antimony content such as, for example, $0.004 \leq z \leq 0.02$, $0.005 \leq z \leq 0.018$, $0.006 \leq z \leq 0.016$, $0.008 \leq z \leq 0.015$, $0.01 \leq z \leq 0.018$, $0.01 \leq z \leq 0.014$, $0.004 \leq z \leq 0.014$, or $0.004 \leq z \leq 0.01$; and a high nitrogen content such as, for example, $0.02 \leq y \leq 0.10$, $0.021 \leq y \leq 0.09$, $0.024 \leq y \leq 0.085$, $0.026 \leq y \leq 0.08$, $0.03 \leq y \leq 0.06$, or $0.04 \leq y \leq 0.06$.

$Ga_{1-x}In_xN_yAs_{1-y-z}Sb_z$ subcells can comprise x, y, and z values of $0.025 \leq x \leq 0.19$, $0.008 \leq y \leq 0.09$, and $0.001 \leq z \leq 0.02$; $0.025 \leq x \leq 0.19$, $0.008 \leq y \leq 0.09$, and $0.001 \leq z \leq 0.018$; $0.025 \leq x \leq 0.19$, $0.008 \leq y \leq 0.09$, and $0.001 \leq z \leq 0.016$; $0.025 \leq x \leq 0.19$, $0.02 \leq y \leq 0.09$, and $0.001 \leq z \leq 0.02$; $0.025 \leq x \leq 0.19$, $0.02 \leq y \leq 0.09$, and $0.001 \leq z \leq 0.018$; $0.025 \leq x \leq 0.19$, $0.02 \leq y \leq 0.09$, and $0.001 \leq z \leq 0.016$; $0.025 \leq x \leq 0.19$, $0.008 \leq y \leq 0.09$, and $0.001 \leq z \leq 0.016$; $0.025 \leq x \leq 0.19$, $0.022 \leq y \leq 0.09$, and $0.001 \leq z \leq 0.02$; $0.025 \leq x \leq 0.19$, $0.022 \leq y \leq 0.09$, and $0.001 \leq z \leq 0.018$; or $0.025 \leq x \leq 0.19$, $0.022 \leq y \leq 0.09$, and $0.001 \leq z \leq 0.016$.

Surface mount multijunction photovoltaic cells of the present invention can further comprise an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer-via extending from the back substrate surface to the front side metal pad, wherein the through-wafer-via comprises sidewalls; a passivation layer overlying a portion of the back substrate surface and the sidewalls of the through-wafer-via; and a metal layer overlying the passivation layer and the bottom surface of the front side metal pad within the through-wafer-via.

Surface mount multijunction photovoltaic cells of the present invention can comprise an heteroepitaxial layer comprising one or more elements from group III of the periodic table, N, As, and an element selected from Sb, Bi, and a combination thereof.

Surface mount multijunction photovoltaic cells of the present invention can comprise an heteroepitaxial layer comprises one or more subcells of a multijunction solar cell, wherein at least one of the subcells comprises one or more elements from group III of the periodic table, N, As, and an element selected from Sb, Bi, and a combination thereof.

Surface mount multijunction photovoltaic cells of the present invention can have a through-wafer-via that is characterized by smooth sidewall surfaces and the back substrate surface is free of pitting.

Surface mount multijunction photovoltaic cells of the present invention can further comprise an anti-reflection coating overlying a first portion of the heteroepitaxial layer; a patterned cap region overlying a second portion of the heteroepitaxial layer; a front side metal overlying a portion of the anti-reflection coating and the patterned cap region; a through-wafer via extending from the back substrate surface through a portion of the anti-reflection coating; a passivation layer overlying side walls of the through-wafer-via; a metal layer overlying the passivation layer and plugging the bottom of the through-wafer via; and a metal overlying the metal layer and filling the through-wafer-via.

Photovoltaic modules of the present invention can comprise a plurality of the surface mount multijunction photovoltaic cells of the present invention.

Photovoltaic modules of the present invention can comprise an interconnection substrate comprising a front interconnection substrate surface and a back interconnection substrate surface; and a plurality of surface mount multijunction photovoltaic cells mounted to the interconnection substrate.

Photovoltaic modules provided by the present invention can comprise an interconnection substrate comprising interconnects between each of the plurality of surface mount multijunction photovoltaic cells of the present invention; and a plurality of bypass diodes, wherein each of the plurality of bypass diodes is interconnected to one or more of the plurality of surface mount multijunction photovoltaic cells of the present invention.

Photovoltaic modules of the present invention can comprise a plurality of bypass diodes mounted to the back interconnection substrate surface.

Photovoltaic modules of the present invention can comprise a front surface area and a plurality of surface mount multijunction photovoltaic cells of the present disclosure overlying the front surface area, wherein the photovoltaic modules cover, for example, at least 70% of the front surface area.

Power systems of the present invention can comprise a photovoltaic module of the present disclosure and/or at least one surface mount multijunction photovoltaic cell of the present disclosure.

Methods of fabricating a photovoltaic module of the invention can comprise interconnecting at least one of the surface mount multijunction photovoltaic cells of the present disclosure to an interconnection substrate.

Methods of fabricating a photovoltaic module of the invention can comprise interconnecting a surface mount photovoltaic cell of the present disclosure to an interconnection substrate by surface mounting.

Methods of fabricating a multijunction photovoltaic cell of the present invention can comprise providing a semiconductor wafer, wherein the semiconductor wafer comprises a substrate having a front substrate surface and a back substrate surface; a heteroepitaxial layer overlying the front substrate surface; a front surface contact overlying and electrically connected to a portion of the heteroepitaxial layer; an optical adhesive overlying the front surface contact and the heteroepitaxial layer; and a coverglass overlying the optical adhesive layer; and thinning the substrate.

Methods of the present invention can comprise forming a through-wafer-via interconnecting the front surface contact to a front contact pad underlying the back substrate surface.

Methods of the present invention can comprise forming a back surface contact interconnected to the back substrate surface.

Methods of the present invention can comprise methods of thinning the substrate by wet etching, back-grinding, lift-off, or any combination of any of the foregoing.

Methods of forming a semiconductor device of the present invention can comprise the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and at least one additional subcell overlying the first subcell; and at least one of the first subcell or the at least one additional subcell comprises an alloy comprising one or more elements from group III of the periodic table, N, As, and an element selected from Sb, Bi and a combination thereof; a plurality of patterned cap regions overlying the heteroepitaxial layer; an anti-reflective coating overlying the heteroepitaxial layer; and a corresponding metal region overlying each of the plurality of patterned cap regions; bonding a cover glass to the front side of the semiconductor wafer with an optically clear adhesive; removing a desired amount from the semiconductor wafer by a thinning of the substrate region from the back side of the semiconductor wafer; patterning the back side of the semiconductor wafer with a back etch through-wafer via pattern; etching from the back side of the semiconductor wafer a plurality of through-wafer vias using a single wet etchant mixture, wherein each of the plurality of through-wafer vias extends from the back side of the semiconductor wafer to the anti-reflective coating overlying the heteroepitaxial layer; removing the anti-reflective coating to expose a bottom side of the corresponding metal region with a subsequent wet etching method, wherein the subsequent wet etching method is specific for the removal of the anti-reflective coating; depositing a passivation layer on the through-wafer via walls with standard deposition techniques; depositing a resist pattern on the back side of the semiconductor wafer for back side metal isolation, wherein the resist pattern underlies the passivation layer; depositing a metal on the back side of the semiconductor wafer and on the through-wafer via; and removing the resist pattern and a sacrificial metal.

Methods of forming a semiconductor device of the present invention can comprise the steps of: providing a semiconductor wafer, wherein the semiconductor wafer comprises: a substrate region comprising a front side and a back side; a heteroepitaxial layer overlying the front side of the substrate region, wherein, the heteroepitaxial layer comprises a first subcell and an at least one additional subcell overlying the first subcell; at least one subcell comprises an alloy comprising one or more elements from group III of the periodic table, N, As, and an element selected from Sb, Bi and a combination thereof; and a cap layer overlying the heteroepitaxial layer; patterning the front side of the semiconductor wafer with a front etch through-wafer via pattern; etching from the front side of the semiconductor wafer a plurality of through-wafer vias using a single wet etchant mixture, wherein, each of the plurality of through-wafer vias extends from the front side surface of the semiconductor wafer into the substrate; patterning the plurality of patterned cap regions on the heteroepitaxial layer on the front side of the semiconductor wafer; depositing an anti-reflective coating overlying the heteroepitaxial layer and the through-wafer via sidewalls; removing, from the front side, the anti-reflective coating from the bottom of the through-wafer via holes; depositing a front side resist pattern from the front side of the semiconductor wafer, wherein the front side resist pattern guides metal layer lithography; and depositing a metal on the front side of the semiconductor wafer, on the through-wafer via sidewalls and on the through-wafer via bottom.

Methods of the present invention can comprise an anti-reflective coating that serves as a passivation layer.

Methods of the present invention can have a passivation layer that comprises photosensitive polymers.

Methods of the present invention can have a wet etchant mixture comprising a volumetric ratio of hydrochloric acid of 10% to 50%; volumetric ratio of iodic acid of 10% to 50%; and deionized water, wherein the single wet etchant mixture has a temperature of 10° C. to 140° C.

Methods of the present invention can have a back etch through-wafer via pattern and a front etch through-wafer via pattern formed using a photoresist, using a hard mask, or using both a photoresist and a hard mask.

Methods of the present invention can comprise a semiconductor device comprising a photovoltaic cell such as a multijunction photovoltaic cell.

Methods of the present invention can have a semiconductor device comprising a solar cell or a back-contact solar cell.

Methods of the present invention can comprise filling each of the plurality of through-wafer vias with gold.

Methods of the present invention can comprise bonding a cover glass to the front side surface of the semiconductor wafer with an optically clear adhesive; removing a desired amount of the semiconductor wafer by a thinning of the substrate region from the back side of the semiconductor wafer; depositing a passivation layer with standard deposition techniques or lithography on the back side of the semiconductor wafer, wherein the passivation layer is guided by a passivation layer pattern; depositing a back side metal isolation resist pattern on the back side of the semiconductor, wherein the back side metal isolation resist pattern underlies the passivation layer; depositing a metal on the back side of the semiconductor wafer; and removing the back side metal isolation resist pattern and a sacrificial metal.

Methods of the present invention can comprise the thinning of the substrate region from the back side of the semiconductor wafer by wet etching, back-grinding, substrate lift-off, or a combination of any of the foregoing.

According to an aspect of the invention, a surface mount multijunction photovoltaic cell comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a back surface solder pad underlying a portion of and electrically connected to the back substrate surface; a front surface solder pad underlying and insulated from the back substrate surface; and a through-wafer-via interconnecting the front surface solder pad and the front surface contact.

According to any of the preceding aspects, a substrate is less than 150 μm thick.

According to any of the preceding aspects, a substrate comprises Ge and is from 20 μm to 175 μm thick.

According to any of the preceding aspects, a substrate comprises GaAs and is less than 100 μm thick.

According to any of the preceding aspects, a surface mount multijunction photovoltaic cell is characterized by an area less than 4 cm$^2$.

According to any of the preceding aspects, a surface mount multijunction photovoltaic cell is characterized by a unit mass per area of less than 0.09 g/cm$^2$.

According to any of the preceding aspects, a heteroepitaxial layer comprises at least two junctions.

According to any of the preceding aspects, the heteroepitaxial layer comprises $Ga_{1-x}In_xN_yAs_{1-y-z}Sb_z$; and the content values for x, y, and z are within composition ranges as follows: $0.03 \leq x \leq 0.22$, $0.007 \leq y \leq 0.055$ and $0.001 \leq z \leq 0.02$.

According to any of the preceding aspects, a surface mount multijunction photovoltaic cell further comprises: an antireflection coating overlying a first portion of the heteroepitaxial layer; a patterned cap region overlying a second portion of the heteroepitaxial layer; a front side metal pad overlying and electrically connected to the patterned cap region, wherein the front side metal pad comprises a bottom surface; and a through-wafer-via extending from the back substrate surface to the front side metal pad, wherein the through-wafer-via comprises sidewalls; a passivation layer overlying a portion of the back substrate surface and the sidewalls of the through-wafer-via; and a metal layer underlying the passivation layer and the bottom surface of the front side metal pad within the through-wafer-via.

According to any of the preceding aspects, a heteroepitaxial layer comprises one or more elements from group III of the periodic table, N, As, and an element selected from Sb, Bi, and a combination thereof.

According to any of the preceding aspects, a heteroepitaxial layer comprises one or more subcells of a multijunction solar cell, wherein at least one of the subcells comprises one or more elements from group III of the periodic table, N, As, and an element selected from Sb, Bi, and a combination thereof.

According to any of the preceding aspects, a through-wafer-via is characterized by smooth sidewall surfaces and the back substrate surface is free of pitting.

According to any of the preceding aspects, a surface mount multijunction photovoltaic cell further comprises: an anti-reflection coating underlying a first portion of the heteroepitaxial layer; a patterned cap region underlying a second portion of the heteroepitaxial layer; a front side metal overlying a portion of the anti-reflection coating and the patterned cap region; a through-wafer via extending from the back substrate surface through a portion of the anti-reflection coating; a passivation layer overlying side walls of the through-wafer-via; a metal layer overlying the passivation layer and plugging the bottom of the through-wafer via; and a metal overlying the metal layer and filling the through-wafer-via.

According to any of the preceding aspects, a surface mount multijunction photovoltaic cell further comprises an ARC layer between a portion of the front side metal and the heteroepitaxial layer.

According to any of the preceding aspects, a surface mount multijunction photovoltaic cell further comprises an ARC layer between a portion of the through wafer via sidewall and the patterned cap region.

According to an aspect of the invention, a photovoltaic module comprises a plurality of the surface mount multijunction photovoltaic cells according to the present invention.

According to any of the preceding aspects, a photovoltaic module comprises: an interconnection substrate comprising a front interconnection substrate surface and a back interconnection substrate surface; and a plurality of surface mount multijunction photovoltaic cells according to the present invention mounted to the interconnection substrate.

According to any of the preceding aspects, an interconnection substrate comprises: interconnects between each of the plurality of surface mount multijunction photovoltaic cells according to the present invention; and a plurality of bypass diodes, wherein each of the plurality of bypass diodes is interconnected to one or more of the plurality of surface mount multijunction photovoltaic cells according to the present invention.

According to any of the preceding aspects, each of the plurality of bypass diodes is mounted to the interconnection substrate.

According to any of the preceding aspects, the module comprises a front surface area; and the plurality of surface mount multijunction photovoltaic cells cover at least 70% of the front surface area.

According to an aspect of the invention, a power system comprises a photovoltaic module according to the present invention.

According to the present invention, a method of fabricating a photovoltaic module comprises interconnecting at least one of the surface mount multijunction photovoltaic cells according to the present invention to an interconnection substrate.

According to any of the preceding aspects, interconnecting comprises surface mounting.

According to aspects of the invention, a method of fabricating a multijunction photovoltaic cell, comprises: providing a semiconductor wafer, wherein the semiconductor wafer comprises: a substrate having a front substrate surface and a back substrate surface; a heteroepitaxial layer overlying the front substrate surface; a front surface contact overlying and electrically connected to a portion of the heteroepitaxial layer; an optical adhesive overlying the front surface contact and the heteroepitaxial layer; and a coverglass overlying the optical adhesive layer; and thinning the substrate.

According to any of the preceding aspects, a method further comprising, forming a through-wafer-via interconnecting the front surface contact to a front contact pad underlying the back substrate surface.

According to any of the preceding aspects, a method further comprising forming a back surface contact interconnected to the back substrate surface.

According to any of the preceding aspects, thinning the substrate comprises wet etching, back-grinding, lift-off, or any combination of any of the foregoing.

According to aspects of the invention, a surface mount multijunction photovoltaic cell comprises: a substrate having a front substrate surface and a back substrate surface; a heteroepitaxial layer overlying the front substrate surface; a front surface contact overlying a portion of and electrically connected to the heteroepitaxial layer; an optical adhesive overlying the front surface contact and the heteroepitaxial layer; a coverglass overlying the optical adhesive; a passivation layer underlying a portion of the back substrate surface; a back metal pad underlying a portion of the passivation layer; a through-wafer-via electrically interconnecting the front metal contact and the back metal pad; and a backside metal electrically connected to the back substrate surface.

According to any of the preceding aspects, a surface mount multijunction photovoltaic cell comprises a patterned cap region overlying a portion of the heteroepitaxial layer; and an antireflection coating overlying a portion of the heteroepitaxial layer; wherein the front surface contact overlies the patterned cap region and is electrically connected to the patterned cap region.

According to any of the preceding aspects, the antireflection coating overlies the heteroepitaxial within the patterned cap region; and the antireflection coating overlies the sidewalls of the through-wafer-via.

According to any of the preceding aspects, a surface mount multijunction photovoltaic cell comprises a metal plug at least partially filling the through-wafer-via.

According to an aspect of the invention, a photovoltaic module comprises a plurality of the surface mount multijunction photovoltaic cells according to the present invention.

According to any of the preceding aspects, a photovoltaic module comprises: an interconnection substrate comprising a front interconnection substrate surface and a back interconnection substrate surface; and a plurality of surface mount multijunction photovoltaic cells according to the present invention mounted to the interconnection substrate.

According to any of the preceding aspects, an interconnection substrate comprises: interconnects between each of the plurality of surface mount multijunction photovoltaic cells according to the present invention; and a plurality of bypass diodes, wherein each of the plurality of bypass diodes is interconnected to one or more of the plurality of surface mount multijunction photovoltaic cells according to the present invention.

According to any of the preceding aspects, each of the plurality of bypass diodes is mounted to the interconnection substrate.

According to any of the preceding aspects, the module comprises a front surface area; and the plurality of surface mount multijunction photovoltaic cells cover at least 70% of the front surface area.

According to an aspect of the invention, a power system comprises the photovoltaic module according to the present invention.

According to any of the preceding aspects, a method of fabricating a photovoltaic module comprises interconnecting at least one of the surface mount multijunction photovoltaic cells according to the present invention to an interconnection substrate.

According to any of the preceding aspects, interconnecting comprises surface mounting.

According to an aspect of the invention, a method of fabricating a multijunction photovoltaic cell comprises: providing a semiconductor wafer, wherein the semiconductor wafer comprises: a substrate having a front substrate surface and a back substrate surface; a heteroepitaxial layer overlying the front substrate surface; and a patterned cap region overlying a first portion of the heteroepitaxial layer; etching a through-wafer-via extending from the heteroepitaxial layer to within the substrate; depositing an antireflection coating on a second portion of the heteroepitaxial layer and on a sidewall and a bottom of the through-wafer-via; etching the antireflection coating on the bottom of the through-wafer-via to expose the substrate; depositing a front surface contact overlying at least a portion of the patterned cap region, the antireflection coating within the patterned cap region, the sidewalls of the through-wafer-via, and the bottom of the through-wafer-via; applying an optical adhesive overlying the front surface contact, the patterned cap region, and the antireflection coating; applying a coverglass overlying the optical adhesive; and thinning the substrate.

According to any of the preceding aspects, a method further comprises forming a back surface contact interconnected to the back substrate surface.

There are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A surface mount multijunction photovoltaic cell, comprising:
   a substrate having a front substrate surface and a back substrate surface;
   a heteroepitaxial layer overlying the front substrate surface;
   an antireflection coating overlying at least a first portion of the heteroepitaxial layer;
   a patterned cap region overlying a second portion of the heteroepitaxial layer and electrically connected to the heteroepitaxial layer;
   a front side metal pad overlying and electrically connected to the patterned cap region, wherein the front side metal pad comprises a bottom surface;
   a back surface solder pad underlying a portion of and electrically connected to the back substrate surface;
   a front surface solder pad underlying and insulated from the back substrate surface;
   a through-wafer-via formed through the substrate and heteroepitaxial layer interconnecting the front surface solder pad and the front side metal pad; a passivation layer underlying a portion of the back substrate surface and disposed on sidewalls of the through-wafer-via; wherein
   at least a portion of the antireflection coating overlying the at least first portion of the heteroepitaxial layer is disposed between the passivation layer on the sidewalls of the through-wafer-via and the patterned cap region and between the front side metal pad and the heteroepitaxial layer
   an optical adhesive overlying the front side metal pad, the patterned cap region, and the antireflection coating; and
   a coverglass overlying the optical adhesive.

2. The surface mount multijunction photovoltaic cell of claim 1, wherein the substrate is less than 150 μm thick.

3. The surface mount multijunction photovoltaic cell of claim 1, wherein the surface mount multijunction photovoltaic cell is characterized by a unit mass per area of less than 0.09 g/cm².

4. The surface mount multijunction photovoltaic cell of claim 1, wherein the heteroepitaxial layer comprises at least two junctions.

5. The surface mount multijunction photovoltaic cell of claim 1,
   wherein the front side metal pad comprises a bottom surface
   wherein the front surface solder pad underlies the passivation layer and the bottom surface of the front side metal pad within the through-wafer-via.

6. The surface mount multijunction photovoltaic cell of claim 1, wherein the sidewalls have smooth surfaces and the back substrate surface is free of pitting.

7. The surface mount multijunction photovoltaic cell of claim 1, further comprising
   a metal filling the through-wafer-via.

8. A photovoltaic module comprising a plurality of the surface mount multijunction photovoltaic cells of claim 1.

9. The photovoltaic module of claim 8, comprising:
   an interconnection substrate; and
   wherein the plurality of surface mount multijunction photovoltaic cells are mounted to the interconnection substrate.

10. The photovoltaic module of claim 9, wherein the interconnection substrate comprises:
    interconnects between each of the plurality of surface mount multijunction photovoltaic cells; and
    a plurality of bypass diodes, wherein each of the plurality of bypass diodes is interconnected to one or more of the plurality of surface mount multijunction photovoltaic cells, and
    wherein each of the plurality of bypass diodes is mounted to the interconnection substrate.

11. The photovoltaic module of claim 8, wherein,
    the photovoltaic module comprises a front surface area; and
    the plurality of surface mount multijunction photovoltaic cells cover at least 70% of the front surface area.

12. A power system comprising at least one photovoltaic module of claim 8.

13. A method of fabricating a photovoltaic module, comprising surface mounting at least one surface mount multijunction photovoltaic cell of claim 1 to an interconnection substrate.

* * * * *